United States Patent
Ciardella et al.

(10) Patent No.: US 9,457,372 B2
(45) Date of Patent: Oct. 4, 2016

(54) VISCOUS NON-CONTACT JETTING METHOD AND APPARATUS

(71) Applicant: Advanjet, Rancho Santa Fe, CA (US)

(72) Inventors: Robert L Ciardella, Rancho Santa Fe, CA (US); Duong La, Poway, CA (US); Wai Ching Bessie Chin, Rancho Santa Fe, CA (US)

(73) Assignee: Advanjet, Rancho Santa Fe, CA (US)

( * ) Notice: Subject to any disclaimer, the term of this patent is extended or adjusted under 35 U.S.C. 154(b) by 108 days.

(21) Appl. No.: 14/284,208

(22) Filed: May 21, 2014

(65) Prior Publication Data

US 2014/0252105 A1   Sep. 11, 2014

Related U.S. Application Data

(63) Continuation of application No. 12/984,463, filed on Jan. 4, 2011, now Pat. No. 8,757,511.

(60) Provisional application No. 61/293,837, filed on Jan. 11, 2010.

(51) Int. Cl.
*B05C 11/10* (2006.01)
*B41J 2/04* (2006.01)
(Continued)

(52) U.S. Cl.
CPC .......... *B05C 11/1034* (2013.01); *B05C 5/001* (2013.01); *B41J 2/04* (2013.01); *H01L 21/6715* (2013.01); *B41J 2202/05* (2013.01)

(58) Field of Classification Search
CPC ...... B05C 11/1034; B05C 5/001; B41J 2/04; B41J 2202/05

USPC ....... 239/583, 569, 330; 417/413.1, 53, 478, 417/479, 441; 251/331; 347/68, 69, 70
See application file for complete search history.

(56) References Cited

U.S. PATENT DOCUMENTS

| 4,095,722 A | 6/1978 | Miller |
| 4,383,264 A * | 5/1983 | Lewis .................. B41J 2/14201 347/47 |
| 5,074,443 A | 12/1991 | Fujii et al. |

(Continued)

FOREIGN PATENT DOCUMENTS

| EP | 2143503 A1 | 1/2010 |
| JP | 5168995 A | 7/1993 |

OTHER PUBLICATIONS

Liquidyn, Dispensing System Data sheet, Micro-dispensing valve P-jet.

(Continued)

*Primary Examiner* — Arthur O Hall
*Assistant Examiner* — Viet Le
(74) *Attorney, Agent, or Firm* — Stetina Brunda Garred & Brucker; Lowell Anderson

(57) ABSTRACT

This invention concerns a method and apparatus for dispensing minute quantities of highly viscous material from a jetting needle when an expelling mechanism is activated using a nozzle plate with a jetting chamber having a top formed by a diaphragm and a bottom in fluid communication with a jetting needle. Fluid enters the chamber from an inlet channel and is jetted from the chamber by deforming the diaphragm to block the channel and expel a drop of fluid from the needle. A diaphragm driven metering chamber and/or reservoir chamber can optionally be used provide fluid to the jetting chamber.

17 Claims, 13 Drawing Sheets

(51) Int. Cl.
    *H01L 21/67*     (2006.01)
    *B05C 5/00*     (2006.01)

(56) References Cited

U.S. PATENT DOCUMENTS

| | | | |
|---|---|---|---|
| 5,199,607 A | 4/1993 | Shimano | |
| 5,205,439 A | 4/1993 | Strum | |
| 5,320,250 A | 6/1994 | La et al. | |
| 5,405,050 A | 4/1995 | Walsh | |
| 5,431,343 A | 7/1995 | Kubiak et al. | |
| 5,462,199 A | 10/1995 | Lenhardt | |
| 5,505,777 A | 4/1996 | Ciardella et al. | |
| 5,593,290 A * | 1/1997 | Greisch | F04B 19/006 417/478 |
| 5,711,989 A | 1/1998 | Ciardella et al. | |
| 5,743,960 A | 4/1998 | Tisone | |
| 5,747,102 A | 5/1998 | Smith et al. | |
| 5,913,455 A | 6/1999 | La et al. | |
| 6,082,605 A | 7/2000 | Farnworth | |
| 6,132,035 A * | 10/2000 | Kutami | B41J 2/0452 347/54 |
| 6,173,864 B1 | 1/2001 | Reighard et al. | |
| 6,253,957 B1 | 7/2001 | Messerly et al. | |
| 6,267,266 B1 * | 7/2001 | Smith | B05C 5/001 222/1 |
| 6,270,019 B1 | 8/2001 | Reighard | |
| 6,291,016 B1 | 9/2001 | Donges et al. | |
| 6,325,271 B1 | 12/2001 | Farnworth | |
| 6,329,013 B1 | 12/2001 | Putt | |
| 6,350,494 B1 | 2/2002 | Farnworth | |
| 6,354,471 B2 | 3/2002 | Fujii | |
| 6,415,995 B1 | 7/2002 | Enderle et al. | |
| 6,416,294 B1 | 7/2002 | Zengerle et al. | |
| 6,450,416 B1 | 9/2002 | Berg et al. | |
| 6,537,505 B1 | 3/2003 | LaBudde et al. | |
| 6,915,928 B2 | 7/2005 | Brooks | |
| 7,104,768 B2 | 9/2006 | Richter et al. | |
| 7,131,555 B2 | 11/2006 | Maruyama et al. | |
| 7,296,707 B2 | 11/2007 | Raines et al. | |
| 7,490,735 B2 | 2/2009 | Raines et al. | |
| 7,694,857 B1 | 4/2010 | Fugere | |
| 7,713,034 B2 | 5/2010 | Ogawa | |
| 7,767,266 B2 | 8/2010 | Holm et al. | |
| 7,900,800 B2 | 3/2011 | Hassler, Jr. et al. | |
| 8,056,827 B2 | 11/2011 | Xu | |
| 8,074,467 B2 | 12/2011 | Fiske et al. | |
| 8,136,705 B2 | 3/2012 | Tracy et al. | |
| 8,181,468 B2 | 5/2012 | Fiske et al. | |
| 8,215,535 B2 | 7/2012 | Jolm et al. | |
| 8,262,179 B2 | 9/2012 | Ikushima | |
| 2003/0003027 A1 | 1/2003 | Albert et al. | |
| 2003/0132243 A1 | 7/2003 | Engel | |
| 2003/0185096 A1 | 10/2003 | Hollstein et al. | |
| 2005/0072815 A1 | 4/2005 | Carew et al. | |
| 2006/0077237 A1 | 4/2006 | Shin et al. | |
| 2006/0147313 A1 | 7/2006 | Zengerle et al. | |
| 2006/0157517 A1 | 7/2006 | Fiske et al. | |
| 2007/0145164 A1 | 6/2007 | Ahmadi et al. | |
| 2008/0105703 A1 | 5/2008 | Prentice et al. | |
| 2008/0149691 A1 | 6/2008 | Fujii | |
| 2009/0078720 A1 | 3/2009 | Abernathy et al. | |
| 2009/0095825 A1 | 4/2009 | Ahmadi et al. | |
| 2009/0115825 A1 | 5/2009 | Peng et al. | |
| 2009/0167818 A1 | 7/2009 | Morita | |
| 2010/0181337 A1 | 7/2010 | Ikushima | |
| 2010/0252576 A1 | 10/2010 | Fiske et al. | |
| 2010/0294810 A1 | 11/2010 | Ikushima | |
| 2012/0286072 A1 | 11/2012 | Saidman et al. | |

OTHER PUBLICATIONS

PVA, Data Sheet, Non-contact micro dispensing valve, valve specifications.
Aerojet, Data Sheet, Non-contact jet dispenser for high viscous materials.
EFD, Data Sheet, PicoDot Jet dispensing system.
Asymtek, Data Sheet, High-speed Piezo jet dispensing for liquid crystal fluids.

* cited by examiner

VISCOUS NON-CONTACT JETTING METHOD AND APPARATUS

CROSS-REFERENCE TO RELATED APPLICATIONS

Application claims priority to Provisional Patent Application No. 61/293,837 filed Jan. 11, 2010, and patent application Ser. No. 12/984,463 filed Jan. 4, 2011, the complete contents of which are incorporated herein by reference.

STATEMENT RE: FEDERALLY SPONSORED RESEARCH/DEVELOPMENT

Not Applicable

BACKGROUND

In the semiconductor, electronics and life science industries viscous fluids are frequently dispensed. In the semiconductor industry the demands to reduce the size, weight and power of devices often require minute drops of viscous material to be applied. Non-contact dispensing is preferred because a bare silicon die is extremely fragile and it is deleterious for anything to contact the surface of a semiconductor chip. The manufacturing of printed circuit boards (PCBs) often requires small chips to be attached to a circuit board using viscous adhesives to improve the strength and reliability of the bonds. Many adhesives used in PCB manufacturing are premixed, 2-part epoxies which change viscosity with time and the viscosity change causes problems with dispensing equipment. There is thus a need for a dispensing method and device that is insensitive to viscosity change.

In the life science industry clinical testing to screen for diseases, medical conditions and pharmaceutical development has become increasingly sophisticated. Only minute quantities of reagents, proteins or compounds are required for experimentation. Minute drop volumes of low viscosity fluids in the micro liter and nanoliter range are typical. Non-contact delivery of the fluid is preferred in these applications because the minute drop of viscous fluid is frequently dispensed deep into a micro-well. The dispensing must be very precise and repeatable or erroneous results might be produced. Often fluids in the life science industry are in short supply and very expensive. There is thus a need for a jetting device that minimizes the loss of this precious fluid inside the viscous jet. Further, biological materials are very sensitive to contamination and cross-contamination yet existing devices are complex, difficult to maintain clean and can contribute to contamination or cross-contamination. There is also a need for a jetting device having components in contact with the fluid that are either disposable or easily cleaned.

Viscous jetting technology is similar to the ink jet technology used in computer printers. In both cases a small drop of fluid is jetted from a nozzle and "flies" to the substrate in a non-contact manner. Jetting as used herein refers to non-contact dispensing as compared to contact dispensing. Contact dispensing is the process where a fluid drop on the end of a dispensing tip comes in contact with the target substrate and "wets" or clings to the surface and remains on the surface as the dispensing tip pulls away. In the case of ink jet technology, inks with a viscosity very near water (<10 millipascal-seconds—mPas) are jetted. In the case of viscous jet technologies, fluids with high viscosities (>50 mPas) can be jetted. Examples of viscous fluids include adhesives, fluxes, oils, lubricants, conformal coatings, paints, slurries, UV inks, solvents, reagents, proteins, and enzymes. As used herein, high viscosity fluids have a viscosity >50 mPas.

To produce a free flying jetted drop, a rapid high-pressure condition must exist that transfers enough momentum to force fluid through a nozzle with the appropriate exit velocity for the fluid to break into a free flying drop. There here is a specific range of exit velocities that will produce high-quality jetting. The ability to precisely control the rapid, high-pressure condition and eliminate momentum transfer losses and thus control the exit velocity of the fluid from the dispensing orifice would be beneficial for producing repeatable, high-quality jetted drops of viscous fluid.

Creating a rapid high-pressure condition can be achieved in several ways. For example, one such viscous jetting technique uses a reciprocating solenoid valve. A fluid reservoir is pressurized to a predetermined level, a fluid stream from a reservoir flows through a passage extending through a valve assembly having a valve seat disposed near an outlet end in communication with a dispensing orifice. The fluid stream is broken into small drops by a reciprocating valve stem that is cycled by energizing an air solenoid. The action of closing the valve and the impact of the valve stem hitting the valve seat produces a rapid, high-pressure condition that ejects a drop so it "flies" to the substrate in a non-contact manner. The size of the jetted drop is determined by the flow rate of the fluid stream, the size of the valve stem and seat, and the cycle time of the reciprocating valve stem. As a result of deploying a moving mechanical element within the fluid stream a dynamic fluid seal is required. This dynamic seal is subject to wear with time and generates particles due to the sliding action of the seal. Often it is not just the seal that wears, but also the sliding part can wear and generate particles. These particles are cast off into the fluid as contaminants and can cause serious problems for the highly pure fluids as used in life science applications. The wetted moving parts can be hard to clean by flushing, and can require disassembly and costly, time-consuming repair or replacement. The use of fluid seals also requires the moving parts to be constructed of a wear resistant material or have a wear resistant coating which adds cost to the overall design. The internal geometry to support the reciprocating valve stem makes it a challenge to clean and disassembly is always required to ensure cleanliness especially around the dynamic seal area. There is thus a need for a jetting device and technique that does not require dynamic fluid seals.

Another example of creating a rapid high-pressure condition can be seen in a viscous jetting technique which uses a resilient diaphragm impacted by an external element. Fluid from a pressurized reservoir flows into a jetting chamber which is comprised on one side by a resilient diaphragm. An impact means strikes the diaphragm covering a chamber causing a rapid change in chamber volume which generates a rapid, high-pressure condition which ejects a drop of fluid. This viscous jetting technique cannot always adequately meet the drop-to-drop volume accuracy and repeatability requirements. The pressure in the fluid reservoir is rapidly vented to stop the flow of fluid into the jetting chamber. However, often the speed of the pressure drop in the reservoir is slow and a small amount of fluid will escape from the orifice and remain attached to the external surface of the orifice. The fluid attached to the outside of the orifice can affect the volume of the subsequent jetted drop leading to drop-to-drop inaccuracies or it could cause the drop to cling to the orifice. There is thus a need for a viscous jetting technique that minimizes the possibility of an unwanted fluid left on the outside of the orifice after jetting a drop.

Another example of creating a rapid high-pressure condition is a viscous jetting technique that includes a fluid conduit having a flexible tube with a first end connecting to a fluid reservoir and the second end having a dispensing orifice. A displacer connected to a piezoelectric element partially compresses the tube near the outlet end, displaces a volume of tube which creates a rapid high-pressure condition, and jets a drop of fluid. The fluid is refilled in the tube by means of capillary forces. The use of capillary forces to refill the tube limits the speed of refill when using high viscosity fluids. Also, the volume of the jetted drop is not equal to the volume displacement of the tube. The volume displacement forces fluid in two directions: out the orifice and back toward the reservoir. The volume of fluid that flows in each direction depends on the specific flow resistance and compliance of each path. This fluid flow balance between the fluid exiting the orifice and moving backwards toward the reservoir is extremely important in this type of jetting device. Significant variations in drop-to-drop volume can occur if the temperature, pressure or viscosity of the fluid changes the flow balance. The above jetting technique can also be subject to drop-to-drop volume variations as the material of the tube becomes progressively more distorted from use and thus has a variable displacement over time. There is thus a need for a jetting technique that allows fluid in the jetting chamber to only flow out.

It is well known in the industry that a positive metering device, like a syringe pump, an auger pump, or a peristaltic pump can meter an accurate volume of fluid which is substantially independent of the temperature, viscosity and flow characteristics of the fluid and downstream path. While it is possible to use many types of positive metering devices to refill a jet chamber, factors like cost, simplicity, size, serviceability and easy cleaning must be considered. For example, syringe pumps are usually large and bulky and are not easily mounted close to the jetting chamber assembly resulting in a long fluid path between the pump and the solenoid. The increased fluid resistance and compliance can result in a slow response time as the pressure builds slowly inside the long connecting tubing. Also, a one-way valve must be placed in series between the syringe pump and the reservoir which adds cost and complexity to the system. An auger pump can be mounted in close proximity to the jetting chamber reducing the length of the flow path between the pump and the jetting chamber. An auger pump requires a feed screw rotating inside a close fitting chamber. The complexity of the internal mechanism increases cost, is subject to wear, and is hard to clean. An auger feed screw pump would not be desirable when cross-contamination must be avoided. Peristaltic pumps are often used in applications where cross-contamination must be avoided. A typical rotary peristaltic pump employs a plurality of rollers which create squeeze points that moves an occlusion of fluid through a captive tube. The tube material is usually a low-cost, flexible elastomer like silicone which can easily be detached from the pump and disposed, thus eliminating the need to clean the wetted fluid path. However, to accommodate the squeezing motion, the length of the tube is long and the volume of fluid inside the tube is substantial. When using precious fluids the large volume of fluid lost when a tube is replaced is undesirable. There is thus a need for a method of refilling a jetting chamber that meters a precise amount of fluid which is responsive, cost effective and easy to clean.

BRIEF SUMMARY

It is the objective of this invention to provide a non-contact jetting method and apparatus to accurately jet minute quantities of viscous fluid.

It is further objective of this invention to provide an improved jetting chamber assembly which will jet a constant volume drop of viscous fluid. A jetting chamber assembly as used here refers to a space containing a volume of fluid which is in communication with a dispensing orifice and is downstream of a forcing element. A forcing element as defined here is a means to generate a rapid, high-pressure condition in the jetting chamber assembly which transfers momentum to a volume of fluid to eject a drop of fluid out an orifice.

It is a further objective of this invention to provide an improved method of filling the jetting chamber assembly with a repeatable, known amount of viscous fluid.

It is a further objective of this invention to provide a positively metered amount of fluid to fill the jetting chamber assembly.

It is further an objective of this invention to provide an improved jetting chamber assembly which can accommodate an adjustable amount of fluid.

It is further an objective of this invention to provide a method to fill the jetting chamber assembly with an adjustable amount of fluid.

It is further an objective of this invention to provide an improved jetting chamber where the flow of fluid during the jetting cycle is substantially toward the dispensing orifice.

It is a further objective of this invention to provide an improved viscous jetting apparatus which is easy to clean and minimizes cross contamination between fluids.

It is a further objective of this invention to provide an improved jetting apparatus which minimizes the volume of fluid contained within.

It is a further the objective of this invention to provide an improved viscous jetting apparatus which minimizes the volume contained between the fluid source and the jetting chamber assembly.

It is a further objective of this invention to provide an improved jetting method that eliminates the requirement for a sliding dynamic fluid seal.

It is a further objective of this invention to provide an improved jetting chamber assembly which withdraws unwanted fluid from the dispensing orifice.

It is a further an objective of this invention to provide an improved jetting chamber assembly that allows for cost-effective replacement of parts that contact the fluid.

One or more of these objectives is advantageously achieved by providing a viscous jetting apparatus for jetting minute quantities of viscous fluid as described further in this disclosure. The jetting chamber assembly apparatus may include a pressurized fluid source, a jetting chamber, a compliant diaphragm, an inlet channel, an outlet path, an orifice, a supporting structure, and a pressure source. The jetting chamber has as its top wall a suitably flexible, compliant diaphragm. The diaphragm is contained between the jetting chamber and the supporting structure and is easily removed for cleaning or replacement. The jetting chamber communicates with a dispensing orifice by means of an outlet conduit. The jetting chamber is connected to a fluid inlet channel which communicates with a pressurized viscous fluid source. The fluid inlet channel is at least partially in communication with the compliant diaphragm during a portion of the operation of the apparatus. Fluid flows from a fluid source through the inlet channel and into the jetting chamber. The diaphragm is forced to rapidly deform away from the supporting structure by a pressure means. During the initial deflection of the diaphragm it intrudes into the interface between the jetting chamber and the fluid inlet channel in such a way as to impede the flow of fluid from the source, thus containing a volume of fluid between the jetting chamber and the dispensing orifice. The diaphragm continues to deform into the jetting chamber and conformally mates with the jetting chamber sides. This displaces a known amount of fluid contained within the jetting chamber and ejects a drop of fluid that breaks away from the dispensing orifice and flies to a substrate. The pressure means is exhausted and the diaphragm starts to relax and pulls away from the jetting chamber sides and its preferably flat condition. Before it retracts far enough to open the inlet channel, a suck-back condition is created which pulls fluid away for the orifice and up into the outlet path creating a vacant volume between the fluid and the orifice. Any unwanted fluid clinging to the outside of the orifice is pulled back as well. Once the diaphragm retracts far enough to open the inlet channel, fluid from the source enters the jetting chamber and partially fills the vacant volume and the sequence is repeated. No vacuum is believed needed to cause the diaphragm to repeatedly return to its undeformed position. On the other hand, exerting a vacuum through air conduits 28, 52, 54 to retract the deformed diaphragm 24 can speed up the cycle time at which fluid can be expelled from jetting chamber 12. Advantageously, the diaphragm hardness, thickness and material are selected relative to the viscosity of the fluid being jetted so that the diaphragm 24 retracts to its flat condition at a sufficiently slow rate that no air is entrained in the viscous fluid being jetted. This retraction to the flat condition is preferably without the aid of vacuum through the conduits 28, 52, 54, which would alternate with the positive pressure deforming the diaphragm into the various chambers.

There is also advantageously provided a jetting chamber assembly apparatus that includes a fluid source, a jetting chamber, a compliant diaphragm, an inlet channel, an outlet path, an orifice, a supporting structure, and a mechanical forcing element. In this assembly the diaphragm is forced to rapidly deform by a mechanical forcing element that may be contained within the supporting structure for the diaphragm. In doing so the diaphragm initially intrudes into the interface between the jetting chamber and the fluid inlet channel in such a way as to impede the flow of fluid from the source, thus containing a volume of fluid between the jetting chamber and the dispensing orifice. The diaphragm continues to deform into the jetting chamber and while preferably conformally mating with the chamber sides, it may not conformally mate with the jetting chamber sides. This displaces a known amount of fluid contained within and ejects a drop of fluid that breaks away from the dispensing orifice and flies to a substrate. The mechanical forcing element is retracted allowing the diaphragm to relax. Before it retract far enough to open the inlet channel, a suck-back condition is created which pulls fluid away from the orifice creating a vacant volume as discussed above and described in more detail later.

There is also advantageously provided a method of jetting minute quantities of viscous fluid. The method includes forcing viscous fluid from a pressurized fluid reservoir to flow through an inlet channel into a jetting chamber for a predetermined time. Advantageously, a fast acting valve is positioned between the pressurized reservoir and the jetting chamber. The amount of fluid that enters the jetting chamber can be incrementally adjusted by the time the valve is allow to be open. Once the desired amount of fluid enters the jetting chamber, the valve is closed blocking fluid communication with the jetting chamber. Thus, the refill cycle is independent of the jetting cycle. When the jetting cycle begins, the fluid inlet channel is blocked, preferably at the jetting chamber or within the jetting chamber, thus further eliminating fluid communication between the fluid reservoir and the jetting chamber. A rapid, high-pressure condition is created in the jetting chamber which transfers momentum to a known volume of fluid forming a free-flying drop of known volume that breaks-off from a dispensing orifice. Not all of the fluid in one or both of the jetting chamber and the outlet conduit is expelled. A suck-back condition is created forming a vacant volume between the jetting chamber and the dispensing orifice. The fluid inlet channel is then unblocked allowing fluid from the fluid reservoir to flow into the jetting chamber and partially filling the vacant volume.

There is also provided a method of jetting minute quantities of viscous fluid in which a precise metered amount of fluid flows into the jetting chamber. Advantageously, the amount of metered fluid can be incrementally adjusted either manually or programmatically to provide a desired refill volume of fluid. The method includes forcing a predetermined amount of viscous fluid from a fluid reservoir through an inlet channel into a jetting chamber, preferably by using of a positive metering device. Once the desired metered amount of fluid has entered the jetting chamber, the fluid inlet channel is blocked eliminating fluid communication between the fluid reservoir and the jetting chamber. A rapid, high-pressure condition is created in the jetting chamber that transfers momentum to the fluid forming a free-flying drop of known volume that breaks-off from a dispensing orifice. A suck-back condition is created forming a vacant volume between the jetting chamber and the dispensing orifice. The fluid inlet channel is then unblocked allowing fluid from the positive metering device into the jetting chamber.

BRIEF DESCRIPTION OF THE DRAWINGS

The structure, operation, and advantages of the presently preferred embodiment of the invention will further become obvious upon consideration of the following description taken in conjunction with the accompanying drawings, in which like numbers refer to like parts throughout, and in which.

DETAILED DESCRIPTION

Figure 1:
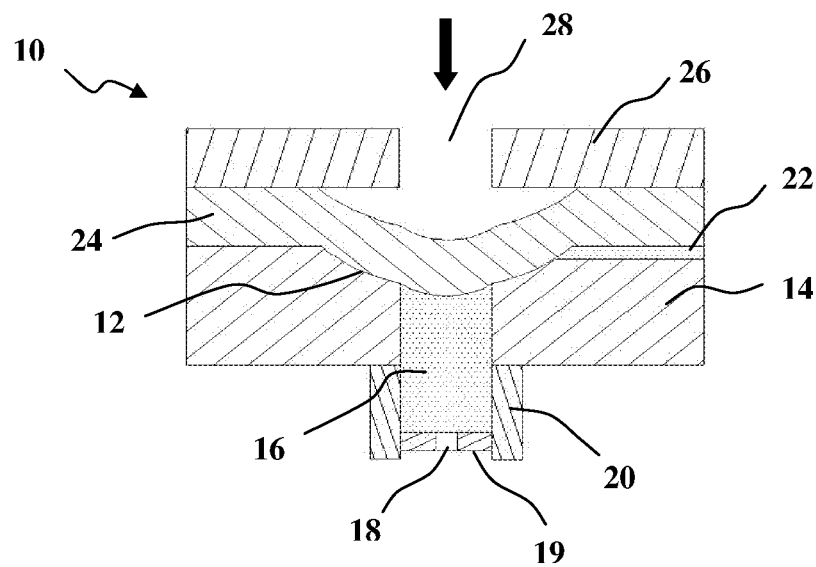
FIG. 1 is a side view, in cross section of a jetting chamber assembly with a fully deflected compliant diaphragm.

The operation will be described first with further details of the construction being described later. Referring to FIGS. 1-5, there is illustrated a jetting chamber assembly 10 and a series of steps shown in FIG. 1-5 that show the sequence of diaphragm position in jetting a minute drop of viscous fluid from the jetting chamber assembly 10. Beginning with FIG. 1, there is illustrated a jetting chamber assembly 10 for jetting minute quantities of viscous fluid. The jetting chamber assembly 10 is in a condition similar to a condition just after a drop of viscous fluid has been jetted and is the starting condition of the method of jetting viscous material. A compliant diaphragm 24 is located between a supporting structure 26 and a nozzle plate 14. High-pressure fluid, preferably air, from an external source (not shown) is directed through the air conduit 28 formed in the supporting structure 26, so the air impinges upon the diaphragm 24. The diaphragm 24 is deflected downward and rests against the sides defining the remainder of jetting chamber 12.

The jetting chamber 12 geometry could be any continuous contour and is sized to provide a predetermined size of expelled fluid. The preferred shape of chamber 12 is spherical, but a parabolic contour is also believed suitable. Other configurations of the chamber 10 are believed suitable. Preferably, the shape of chamber 12 is selected so the diaphragm 24 can abut the sides forming the remainder of the chamber in order to expel all fluid from the chamber during operation. Likewise, the diaphragm 24 is preferably, but optionally, constructed and held by supporting structure 26 so that the diaphragm consistently expels all fluid from chamber 12. The channel 28 is preferably centered on chamber 12 and on a common longitudinal axis with outlet conduit 16 as discussed later.

A portion of the diaphragm 24 preferably but optionally intrudes into the outlet conduit 16 located within the nozzle plate 14. A dispensing needle 20 protrudes from the nozzle plate 14 having an outlet conduit 16 in fluid communication with dispensing orifice 18 at a distal end of the needle 20. The dispensing orifice 18 is shown as an opening in a disc 19 blocking a portion of the needle 20 with the opening being smaller than the interior diameter of needle 20 but the orifice 18 could comprise an open end of the needle with no disc 19 being used. A fluid inlet channel 22 located within nozzle plate 14 communicates with the jetting chamber 12 and is closed by deformation of the diaphragm 24 during operation of the assembly 10. Advantageously the channel 22 is formed in the surface of the nozzle plate 14, with the diaphragm forming a top wall of the channel 22. Fluid is trapped between the jetting chamber 12 and the outlet conduit 16. Fluid flow into the jetting chamber 12 through the inlet channel 22 from a fluid reservoir (not shown) is impeded.

The diaphragm 24 is preferably made of an elastomeric material which returns to its undeformed, preferably planar shape when no distorting or deforming load acts upon the diaphragm. As shown in FIG. 2, as the diaphragm 24 is beginning to return to its undeformed position, the high-pressure air deforming the diaphragm 24 is exhausted out the air conduit 28 formed in supporting structure 26. In FIG. 2, the diaphragm 24 has pulled away from the jetting chamber 12 sides and is at the deflection point just before the fluid inlet channel 22 starts to open. The fluid contained in the outlet conduit 16 has pulled away from the dispensing orifice 18 producing a vacant volume 30a between the disc 19 and remaining fluid. The volume of the vacant volume 30a is equal to the displaced volume of the diaphragm 24 between conditions shown in FIG. 1 and FIG. 2. The speed at which the diaphragm 24 pulls away from the jetting chamber 12 can be important for thinner fluids or for fluids containing dissolved air. Too fast of a deflection could entrap ambient air in the fluid, or could precipitate dissolved air, which could be undesirable. To help mitigate this potential air entrapment, the fluid could be degassed. Alternatively, restricting the exhaust speed of the high-pressure air could be used to slow the speed of the diaphragm 24. Various ways can slow the diaphragm movement, including varying the size of the conduit 28, varying the thickness and material of diaphragm 24, and varying the shape and size of jet chamber 12, among others.

Figure 3:
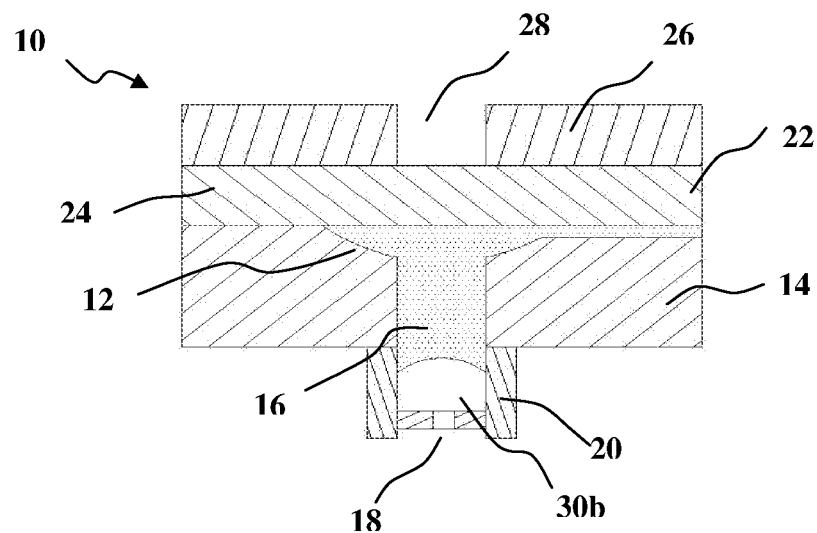
FIG. 3 is a side view, in cross section of the jetting chamber assembly of FIG. 1 with a fully relaxed compliant diaphragm.

As shown in FIG. 3, with the high-pressure completely exhausted, the diaphragm 24 is allowed to move to an undeflected, fully relaxed position. As the diaphragm 24 moves toward its undeflected position, the vacant volume 30b increases. Also, the fluid inlet channel 22 is opened allowing fluid to flow into the jetting chamber 12. Filling the jetting chamber 12 is often referred to as the refill cycle and is a very crucial part of the jetting process. The volume of fluid that flows into the jetting chamber 12 can be incrementally adjusted, thus producing multiple jetted drop volumes. The preferred amount of fluid should not exceed the vacant volume 30b. In one case, a pressurized fluid reservoir (not shown) can be used to feed fluid into the jetting chamber 12. In this case, the pressure level on the fluid reservoir (not shown) and the flow characteristics of the fluid and jetting chamber assembly 10 will determine a fluid flow rate. The actual amount of fluid that flows into the jetting chamber 12 may be proportional to the fluid flow rate and the length of time the fluid is allowed to flow. In another case, a positive metering pump, such as a syringe pump, gear pump, auger pump, or peristaltic pump (none shown), can be used to feed fluid into the inlet channel 22. In this case, a precise, predetermined volume of fluid is forced into the jetting chamber 12 by the positive metering pump which does not vary with time. In either case, the vacant volume 30b is equal to the displaced volume of the diaphragm 24 between the conditions in FIG. 1 and FIG. 3 minus the volume of fluid that is allowed to flow into the jetting chamber 12. More advantageously, the channel 22 is about 25-70% of the chamber depth and preferably about 50% or less. No vacuum is believed needed to cause the diaphragm to repeatedly return to its undeformed, relaxed position. This simplifies the design and avoids the need for applying vacuum to the air channels 28, 52, 54. But a vacuum could be used to withdraw the diaphragm 24 from one or more of the chambers, as desired.

Figure 4:
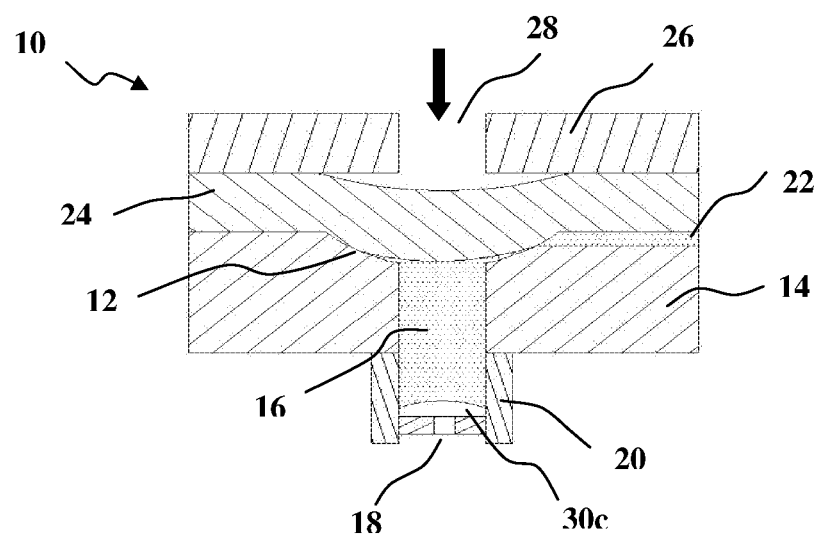
FIG. 4 is a side view, in cross section of the jetting chamber assembly of FIG. 1 with a partially deflected compliant diaphragm at the point in time where the fluid inlet chamber closes.

As shown in FIG. 4, with the high-pressure air being directed through air conduit 28, the diaphragm 24 starts to deflect into the jetting chamber 12. The diaphragm 24 is at the deflection point just after the fluid inlet channel 22 closes. Fluid is now trapped in the jetting chamber 12 and the outlet conduit 16. The vacant volume 30c is reduced by the volume displacement of the diaphragm 24 between the conditions in FIG. 3 and FIG. 4.

Figure 5:
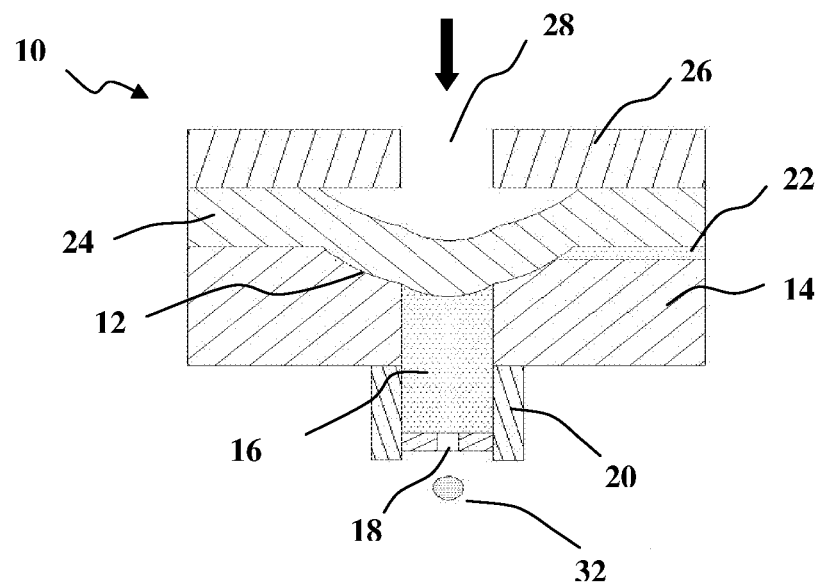
FIG. 5 is a side view, in cross section of the jetting chamber assembly of FIG. 1 with a fully deflected compliant diaphragm and a jetted drop of viscous fluid
Figure 6:
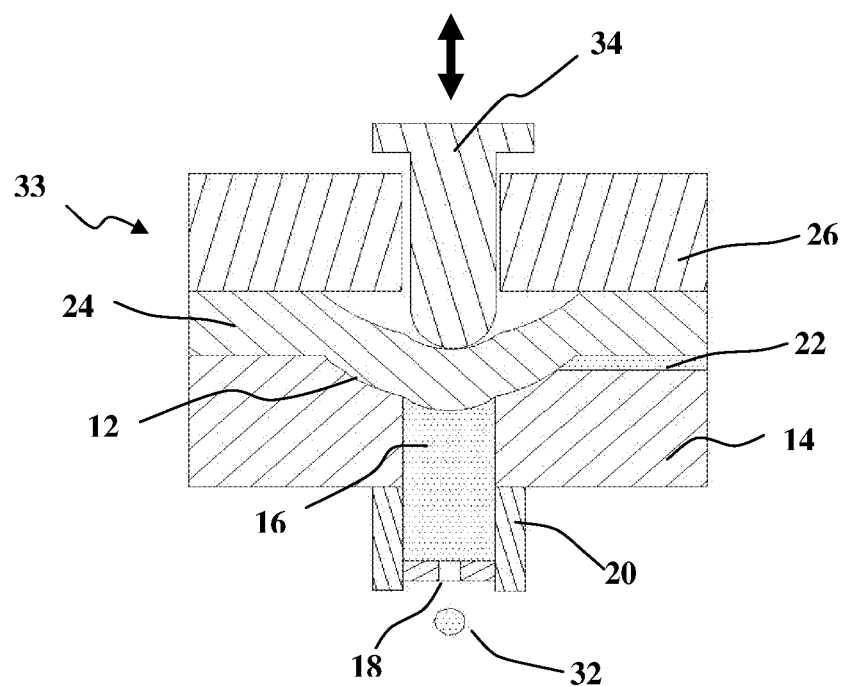
FIG. 6 is a side view, in cross section of a jetting chamber assembly with a fully deflected compliant diaphragm deflected by a mechanical forcing element and jetting a drop of viscous fluid.

As shown in FIG. 5, with high-pressure air being directed through the air conduit 28, the diaphragm 24 deflects downward creating a rapid, high-pressure condition that transfers enough momentum to the fluid in order for a viscous fluid drop 32 to break-off from the orifice. High momentum transfer is desirable especially when jetting viscous fluid. The deflection speed of the diaphragm 24 determines the magnitude and shape of the high-pressure condition and thus the exit velocity and shape of the jetted drop and is dependent on the driving force applied. The driving force on the diaphragm 24 can be applied in several ways. In the case illustrated in FIGS. 1-5, the driving force is high-pressure air directed through an air conduit 28 onto the diaphragm 24. The speed of the diaphragm is dependent upon the magnitude of the air pressure and the area of the diaphragm. The magnitude of the air pressure could be limited by the availability of the air pressure source, thus limiting the speed of the diaphragm. If a faster deflection speed is desired, an impact component can be added to the driving force. Referring to FIG. 6, a jetting assembly 33 contains a mechanical impact element 34 used to impact diaphragm 24, which significantly increases the deflection speed of diaphragm 24. For example, a rod end of an air cylinder or electric solenoid could be used as the impact element 34. Alternatively, a rod connected to a controllable motion device like a moving electric coil could be used as the driving force to impact the diaphragm 24. The advantage of using a controllable driving force is that the velocity and/or the acceleration of the impact element 34 can be controlled as it impacts the diaphragm 24. By controlling the impact element's motion, additional control of the drop's exit velocity and shape can be achieved allowing for a wider range of fluids to be used and better control of the drop quality. Other impact means could be used as well. Alternatively, impact element 34 could be contained within supporting structure 26 and impacted externally.

Figure 7:
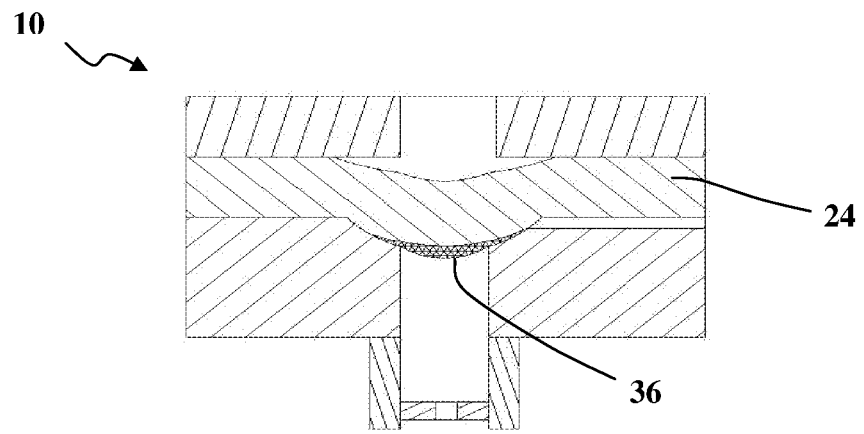
FIG. 7 is a side view, in cross section of a jetting chamber assembly showing the volume displacement of the diaphragm between the position shown in FIG. 4 and the position shown in FIG. 5.

Referring to FIG. 7, there is illustrated the volume displacement 34 which is equal to the volume displacement of the diaphragm 24 between the conditions shown in FIG. 4 and FIG. 5. Since the diaphragm 24 conforms to the jetting chamber 12 sides the volume displacement is known and repeatable. Depending on the stiffness of the diaphragm 24, it can actually displace an additional small volume into the outlet conduit 16 which increases the total displaced volume. The diaphragm 24 displaces a known, repeatable volume which can also be described as a positively displaced volume. This positively displaced volume generates the rapid, high-pressure condition that imparts the required momentum to the fluid to cause a viscous drop 32 to break away for the orifice 18 and fly to the substrate. This positively displaced volume is not necessarily equal to the viscous fluid drop 32 volume, but it is a consistent volume for a given set of inlet flow and diaphragm deformation conditions. Advantageously, the volume of fluid drop 32 is less than the volume of the jetting chamber 12 measured between the bottom of inlet channel 22 and the junction of the chamber 12 sides or walls with the outlet 16.

The diaphragm 24 must be made of a compliant material so it easily conforms to the jetting chamber 12 sides. An elastomeric material such as silicon or neoprene is believed to be a suitable choice for the diaphragm 24. A diaphragm 24 with a durometer between shore 50-90A is believed suitable. The diaphragm 24 material must be chemically compatible with the fluid being jetted. Some fluids can have an adverse effect on the diaphragm 24 material and the overall life of the diaphragm 24 can be compromised. The diaphragm 24 as shown in FIGS. 1-7 is a flat element.

Figure 8:
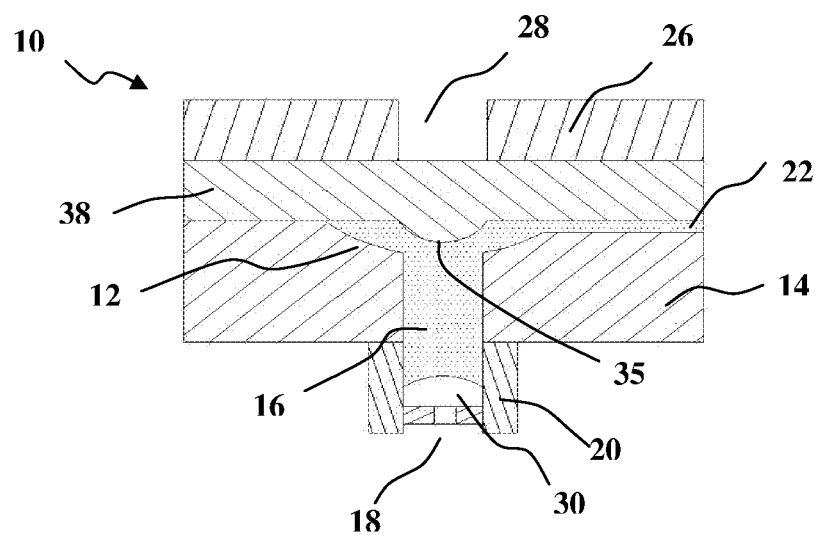
FIG. 8 is a side view, in cross section of a jetting chamber assembly with a fully relaxed compliant diaphragm with a contoured feature on the diaphragm.

The diaphragm 24 need not be flat and a contoured detail could be advantageous. Shown in FIG. 8, is an illustration of a small semi-spherical portion 35 located on the diaphragm 38 and centered over the jetting chamber 12. Advantageously the semi-spherical portion 35 is integrally molded with the diaphragm 24 and extends beyond the remainder of the diaphragm. The semi-spherical portion 35 intrudes into the jetting chamber 12 and reduces the jetting chamber 12 volume. This reduction in volume from semi-spherical portion 35 reduces the vacant volume 30 when the diaphragm returns to its relaxed state. A reduced vacant volume 30 can be preferred in cases when a very minute viscous drop volume 32 is desired. The semi-spherical portion 35 on diaphragm 38 is only an example of one contoured shape as other shapes, including domed, conical or frusto-conical shapes, or other shapes which may be integrally formed as part 38 on diaphragm 24.

Figure 9:
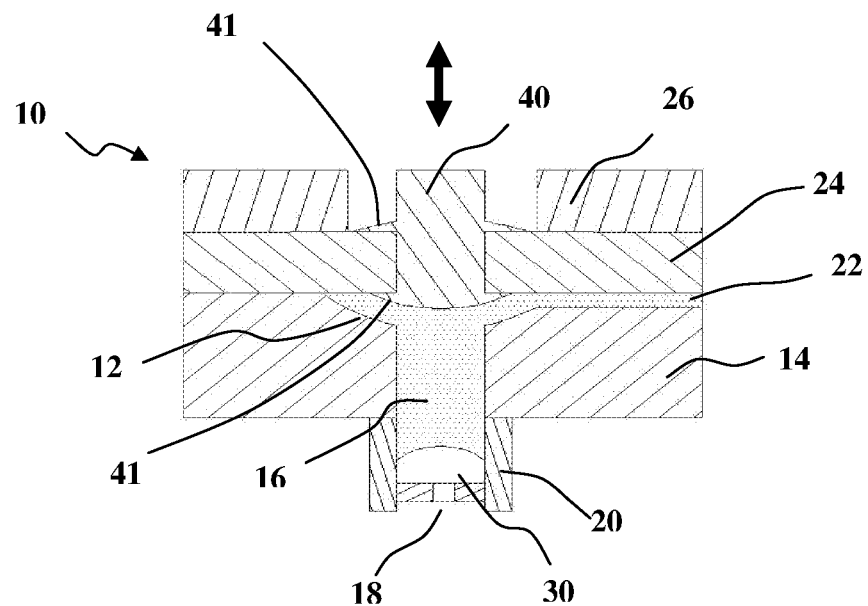
FIG. 9 is a side view, in cross section of an alternative embodiment of a jetting chamber with a fully relaxed compliant diaphragm with a contoured feature attached so it attaches to and protrudes through the diaphragm.

Alternatively, as shown in FIG. 9, the diaphragm 24 may have an insert portion 40 comprised of a different material so the diaphragm 24 has an elastomeric outer portion and a much stiffer or rigid inner insert portion 40. For example, insert portion 40 could be metal or hard plastic, with a domed or semi-spherical portion protruding into jetting chamber 12. The insert 40 may have optional outwardly extending flanges 41 that are clamped, adhered, thermally bonded, molded or otherwise fastened to opposing surfaces of diaphragm 24 as shown in FIG. 9. The fastening method or mechanism will vary with the materials of diaphragm 24 and insert 40. Preferably, the insert 40 is centered over needle 20 and has a longitudinal axis aligned with the longitudinal axis of needle 20 and dispensing orifice 18, with that longitudinal axis passing through the center of the jetting chamber 12.

When a dual material diaphragm 24, 40 is fully deflected, the harder insert portion 40 impacts the sides of the jetting chamber 12 without the damping effect of the elastomeric material forming the remainder of diaphragm 24. The momentum transfer efficiency from harder insert portion 40 is therefore higher. If insert portion 40 included a shape facing opposite the dispensing orifice 18 which also extended through the support structure 26, then a mechanical element 34 could be readily attached to the insert 40 to provide bidirectional forced deflection of the diaphragm 24. The use of a harder insert 40 in diaphragm 24 is preferred when high impact efficiency is required. Or, the bidirectional forced deflection might be preferred when a sticky fluid might tend to restrict the relaxation speed of an elastomeric diaphragm 24. An insert 40 that is at least 5-10 times harder than the remainder of diaphragm 24 extending into chamber 12 is preferred.

Figure 10:
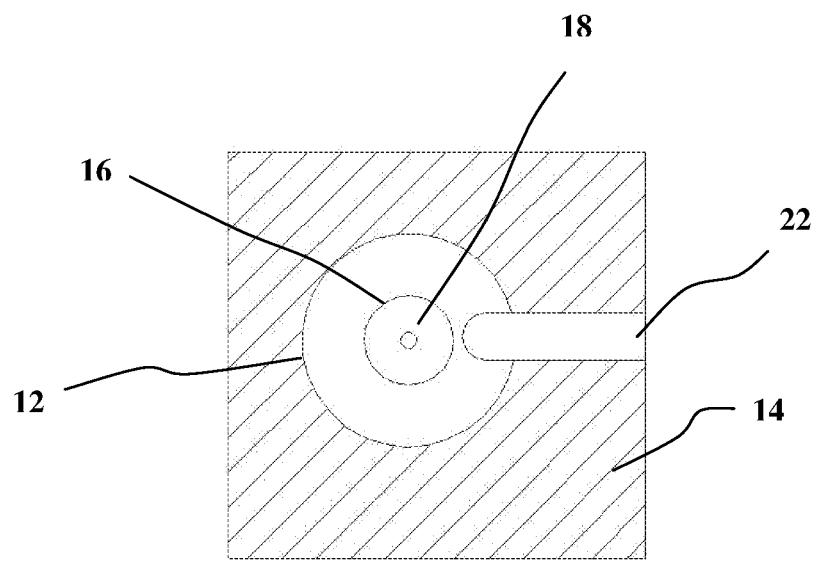
FIG. 10 is a top view, in cross section of a nozzle plate showing a jetting chamber, a fluid inlet channel, an outlet conduit and a dispensing orifice.

Referring to FIG. 10, the nozzle plate 14 is shown in top view. The fluid inlet channel 22 enters into the jetting chamber 12 only part way and does not connect to the outlet conduit 16. That allows deformation of the diaphragm 24 into the jetting chamber 12 to block fluid communication between the channel 22 and jetting chamber 12. If the inlet channel 22 extends the full depth of jetting chamber 12 then the diaphragm 24 cannot block back-flow from the chamber 12 into the channel 22—thus the portion of channel 22 that interfaces with the jetting chamber 12 is shallower than the chamber 12 is deep is preferred. The relative size of the channel 22 and chamber 12 will vary with the viscosity of the fluid and size of the jetted fluid drop 32. A channel 22 around 100-200 μm is believed suitable for most applications jetting minute drops 32 of thinner viscous fluids, with the channel 12 advantageously extending less than about half the depth of the jetting chamber 12 as measured between the flat diaphragm 24 and the curved bottom of the chamber within the outlet conduit 16. The inlet channel 22 could also be contoured along its length with a deeper section residing outside the jetting chamber interface to decrease flow resistance for thicker fluids.

Referring to FIGS. 11-15, there is illustrated a jetting chamber assembly 10 in fluid communication with a dual chamber metering device 80. A sequence of steps is shown that constitute a method of filling the jetting chamber assembly 10 by use of a dual chamber metering device 80 and jetting a minute drop of viscous fluid 32 by the jetting chamber assembly 10. A dual chamber metering device 80 is comprised of a compliant flexible diaphragm 42 located between a supporting structure 56 and a metering plate 44. High-pressure fluid, preferably air, is directed through fluid conduits 52 and 54 in the supporting structure 56 to locally deflect the diaphragm 42 into the corresponding fluid chambers located directly below the diaphragm 42. Located on the surface of the metering plate 44 are first fluid chamber 48 and second fluid chamber 46 connected by fluid flow channel 50 with fluid conduit 52 located to deform the diaphragm 42 into the second fluid chamber 46 and fluid conduit 54 located to deform diaphragm 42 into first fluid chamber 48. The first chamber 48 may be considered a reservoir chamber and the second chamber 46 may be considered a metering chamber. The first reservoir chamber 48 advantageously has a larger volume than the second metering chamber 46 and preferably has a larger volume than the jetting chamber 12. The second metering chamber 48 advantageously has a volume corresponding to or slightly larger than the volume to be jetted from chamber 12 in the jetted drop of viscous fluid 32. The first fluid chamber 48 may have a closed bottom opposite an open top, or it may have a channel in fluid communication with the bottom of the first reservoir chamber 48. The second fluid chamber, or metering chamber 46, preferably has a closed bottom opposite an open top.

The interface of the fluid flow channel 50 at the edges of the first fluid chamber 48 and at the edges of the second fluid chamber 46 is designed so when the diaphragm 42 is displaced into each chamber, flow through corresponding chambers is impeded and preferably blocked. The above described interaction and design of the diaphragm 24 with inlet channel 22 and jetting chamber 12 apply here to the diaphragm 42 and flow channel 50, and chambers 46, 48, and are not repeated. It is noted, however, that if the channel 50 is in fluid communication with the bottom of first reservoir chamber 48, the diaphragm preferably extends into chamber 48 sufficiently to block fluid flow into that chamber from the channel 50. As shown, the assembly 10 and the dual chamber metering device 80 are separate structures. A diaphragm 42 is shown in the dual chamber metering device 80 and a diaphragm 24 is shown in the jetting chamber assembly 10. It can be anticipated to simplify the apparatus and reduce cost; a single shared structure could be used in which diaphragms 24, 42 are the same part, supporting structures 26, 56 are the same part, and nozzle plates 14, metering plate 44 are the same part, with the same parts preferably being integrally formed from a single piece of material. Likewise, while a single diaphragm 24 is used, separate sealing structures could be used around each chamber 12, 46, 48.

Figure 2:
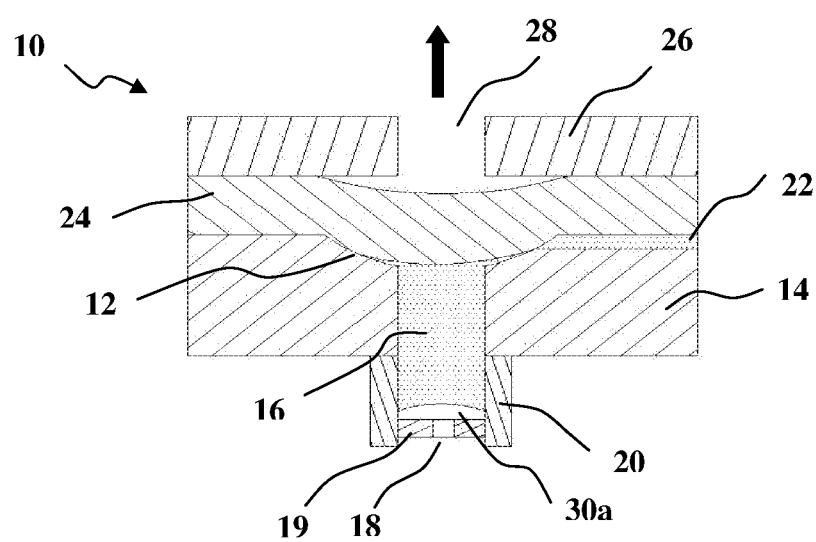
FIG. 2 is a side view, in cross section of the jetting chamber assembly of FIG. 1 with a partially deflected compliant diaphragm at the point in time just before the fluid inlet chamber opens.
Figure 11:
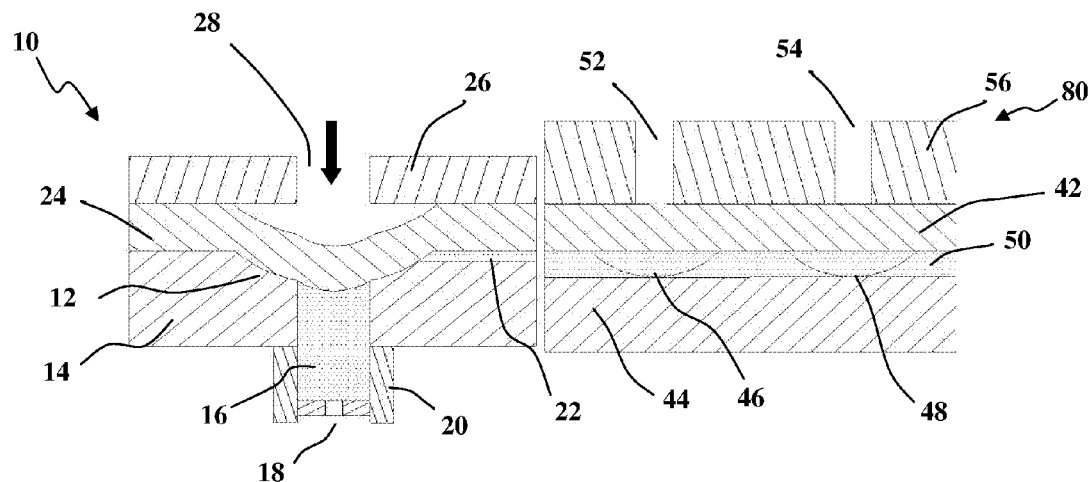
FIG. 11 is a side view, in cross section of the jetting chamber of FIG. 1, with a fully deflected compliant diaphragm communicating with a two chamber metering device with the first chamber open and the second chamber open.

As illustrated in FIG. 11, there is a jetting chamber assembly 10 which is in the identical condition as shown in FIG. 1. The fluid flow channel 50 located in dual chamber metering device 80 is in fluid communication with the jetting assembly 10 via the fluid inlet channel 22 and fluid flow channel 50. The diaphragm 42 is in an undeflected condition allowing fluid from an external fluid reservoir (not shown) connected to the fluid flow conduit 50 to flow into the first fluid chamber 48 and into the second fluid chamber 46 and into the fluid inlet channel 22. Flow is impeded from entering the jetting chamber 12 by the deflected diaphragm 24. Fluid fully fills the first fluid chamber 48, the second fluid chamber 46, the fluid flow conduit 50 and the fluid inlet channel 22. Fluid is also contained within the fluid outlet conduit 16.

Figure 12:
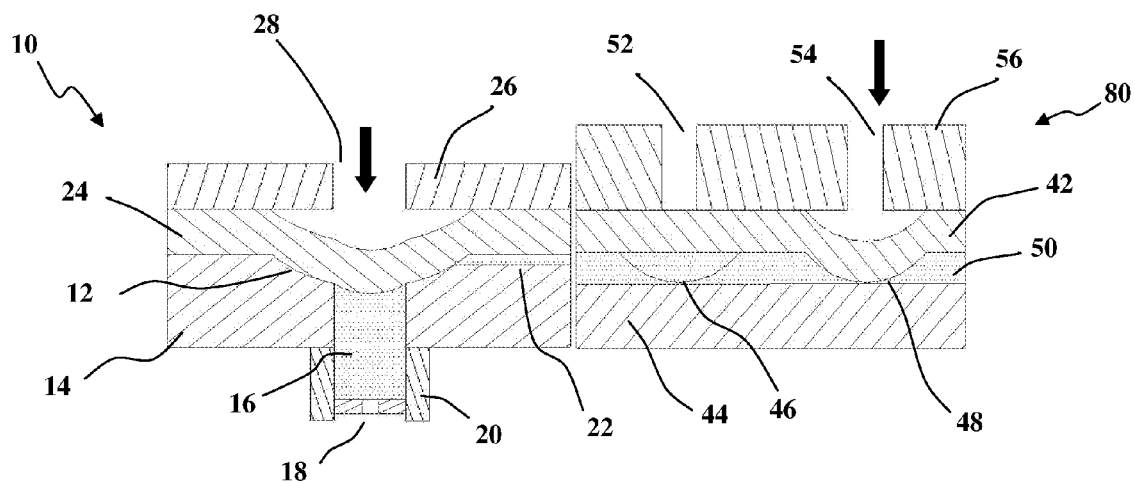
FIG. 12 is a side view, in cross section of the assembly of FIG. 11 having a jetting chamber with a fully deflected compliant diaphragm with the first chamber closed and the second chamber open.

As illustrated in FIG. 12, there is a jetting chamber assembly 10 which is in the identical condition as shown in FIG. 1. The fluid flow channel 50 located in dual chamber metering device 80 is in fluid communication with the jetting assembly 10 via the fluid inlet channel 22. Air from an external pressure source (not shown) directs high-pressure air through fluid conduit 54 and deflects diaphragm 42 into the first fluid chamber 48 forcing fluid from the first fluid chamber 48 to flow back toward the fluid reservoir (not shown). Fluid in the second fluid chamber 46 is now impeded from flowing toward the jetting chamber 12 or toward the first fluid chamber 48 because the diaphragm 24 blocks the flow channel 22 so fluid cannot enter jetting chamber 12 and diaphragm 42 blocks flow through channel 50 into the first fluid chamber 48.

Figure 13:
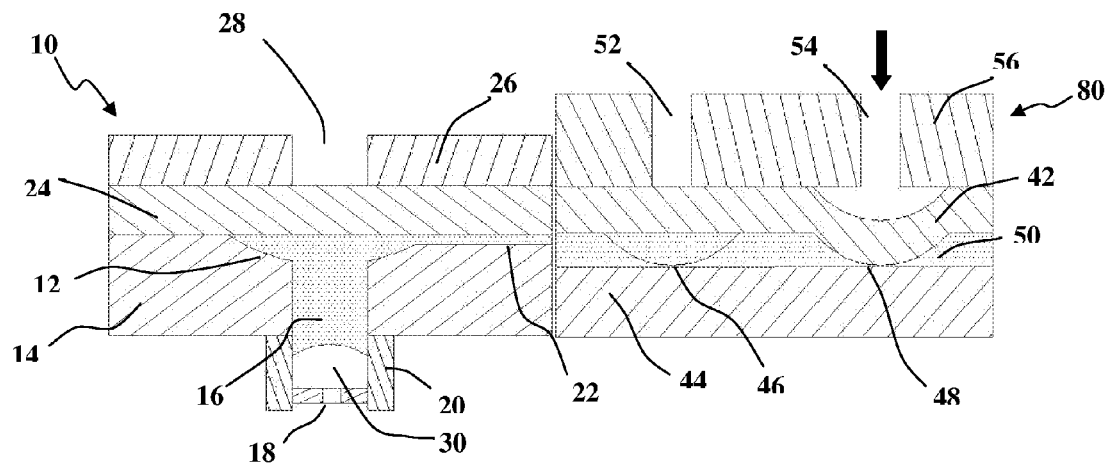
FIG. 13 is a side view, in cross section of the assembly of FIG. 11 having a jetting chamber with a fully relaxed compliant diaphragm with the first chamber closed and the second chamber open.

Referring to FIG. 13, the condition of the dual chamber metering device 80 is identical to the condition shown in FIG. 12. But the high-pressure air that was deflecting diaphragm 24 has been removed and diaphragm 24 has retracted to an undeflected condition creating the vacant volume 30. Jetting chamber 10 is in the condition identical to that shown in FIG. 3. The fluid inlet channel 22 is open so the jetting chamber 12 will accept fluid from the dual chamber metering device 80.

Figure 14:
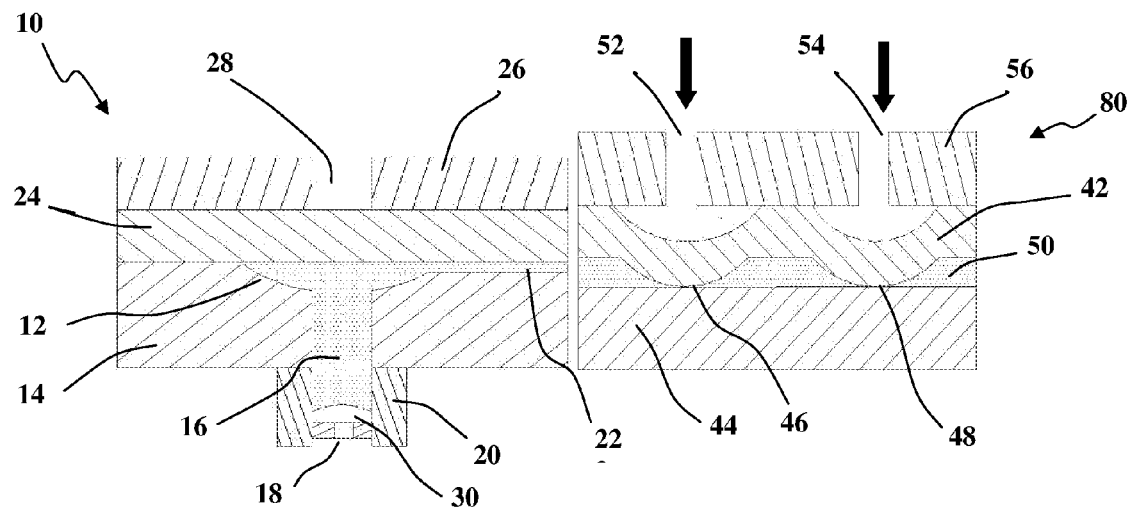
FIG. 14 is a side view, in cross section of the assembly of FIG. 11 having a jetting chamber with a fully relaxed compliant diaphragm with the first chamber closed and the second chamber closed.
Figure 15A:
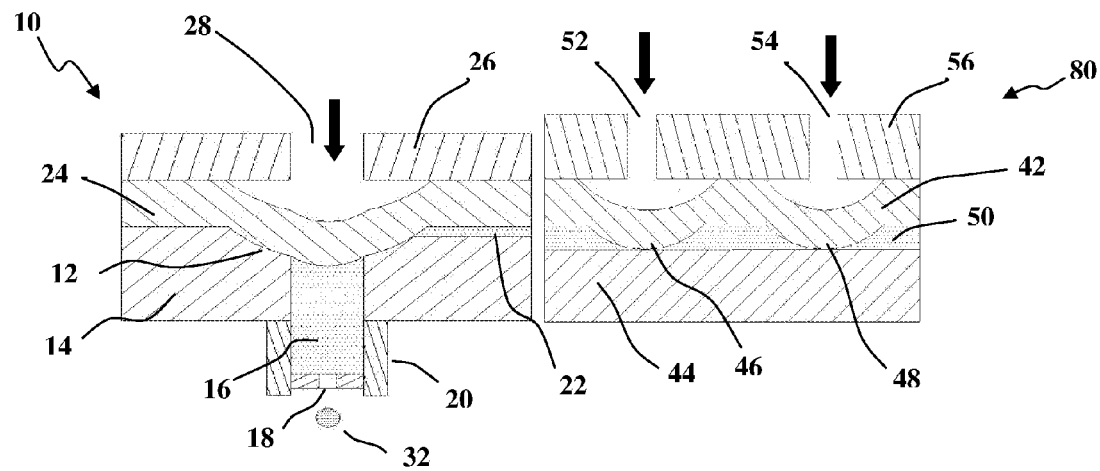
FIG. 15a is a side view, in cross section of the assembly of FIG. 11 having a jetting chamber with a fully deflected compliant diaphragm with the first chamber closed and the second chamber closed and a jetted drop of viscous fluid.

Referring to FIG. 14, the jetting chamber assembly 10 is in the identical condition shown in FIG. 13 until high-pressure air is directed through fluid conduit 52 which deflects diaphragm 42 into the second fluid chamber 46 forcing fluid into the jetting chamber 12 and altering the vacant volume 30. The vacant volume 30 has been reduced by the exact amount of fluid that was displaced from the second fluid chamber 46. The jetted drop volume is directly related to the volume of fluid which is transferred or metered into the vacant volume. The volume of the second fluid chamber 46 advantageously can be incrementally adjusted to provide a predetermined jetted drop volume Referring to FIG. 15a, the dual chamber metering device 80 is in the identical condition shown in FIG. 14. High-pressure air deflects diaphragm 24 creating a rapid, high-pressure condition that jets a drop of viscous fluid 32. To repeat the cycle the high-pressure air in fluid conduits 52 and 54 is exhausted so the dual chamber metering device 80 is in the exact condition shown in FIG. 11. The two chambers 48, 46 provide a metering pump or metering means for providing a predetermined amount of fluid to the jetting chamber 12. Further, the deflected diaphragm 42 into second chamber 46 chamber as shown in FIG. 15 provides means for blocking fluid flow through channel 22 toward the reservoir and for increasing the volume accuracy and volume consistency of jetted fluid 32 during jetting. The deflected diaphragm 42 into the first chamber 48 as shown in FIG. 15 provides redundant means for blocking fluid flow through channel 22 toward the reservoir.

Figure 15B:
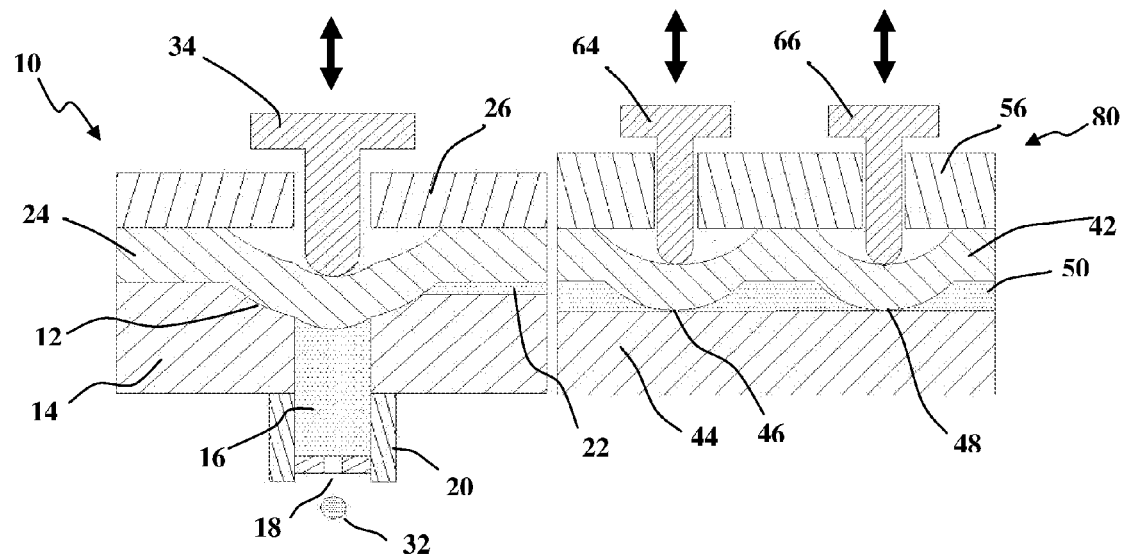
FIG. 15b is a side view, in cross section of the assembly of FIG. 11 having a jetting chamber with a fully deflected compliant diaphragm with the first chamber closed and the second chamber closed and a jetted drop of viscous fluid by means of impact elements.

Shown in FIG. 15b is an alternative construction that illustrates that the actuation of fluid flow into and out of fluid chambers 46, 48 is not limited to fluid deformation of diaphragm 42. The mechanical impact elements 64 and 66 may optionally also be configured and operated like the impact element 34. The dual chamber metering device 80 is in the identical condition shown in FIG. 14 except the high-pressure air has been replaced with impact elements 64, and 66. Impact elements 64 and 66 deflect diaphragm 42 into the fluid chambers 46 and 48 respectively. Impact element 34 deflects diaphragm 24 creating a rapid, high-pressure condition that jets a drop of viscous fluid 32. To repeat the cycle the impact elements 64 and 66 are retracted so the dual chamber metering device 80 is in the exact condition shown in FIG. 11.

Figure 16A:
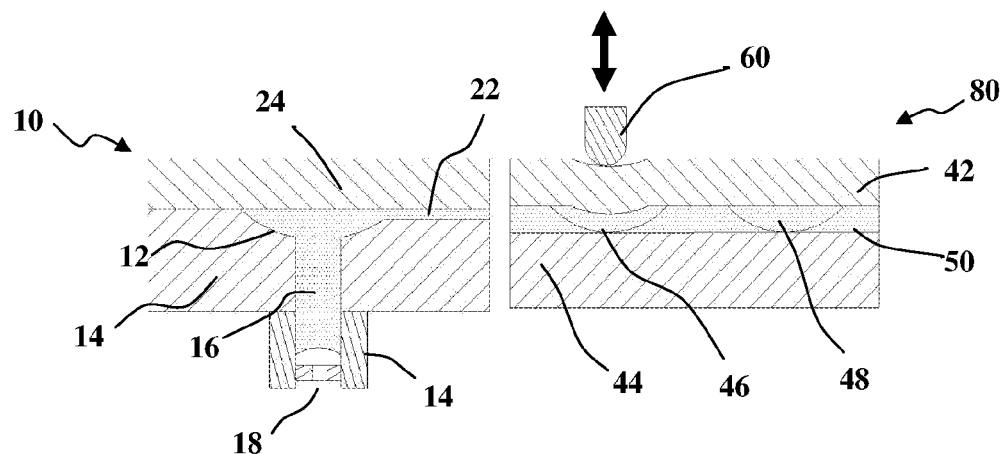
FIG. 16a is a side view, in cross section of a further embodiment of the assembly of FIG. 11 having a jetting chamber with a fully relaxed compliant diaphragm communicating with a two chamber metering device with the first chamber open and the second chamber open with an adjustment element causing a partially deflected diaphragm incrementally reducing the volume of the second chamber.

In FIG. 16a, there is illustrated a dual chamber metering device 80 and a jetting chamber assembly 10. A mechanical adjusting element 60 impinges the diaphragm 42 directly over the second fluid chamber 46 for adjusting the volume in the second fluid chamber 46. The adjusting element 60 is not used to deflect the diaphragm 42 into the second fluid chamber 46 to transfer fluid into the jetting chamber 12. Rather the adjusting element 60 provides the capability to incrementally change the volume of fluid which is transferred into the jetting chamber 12 during the step shown in FIG. 14. The position of adjusting element 60 can be manually positioned changing the volume of the second fluid chamber and therefore the volume of the fluid transferred into the vacant volume. Preferably, the position of adjusting element 60 is such to allow both an increase and a decrease in the second chamber volume when adjusted. Alternatively, the adjusting element 60 could be attached to a controllable device (not shown) such as a motor so the position of the adjusting element can be programmatically changed to provide a predetermined volume. Advantageously, a measuring device (not shown) can be used to measure the size or volume of a jetted drop compared to a predetermined size or volume to determine an error condition. If an error condition is measured, the position of the adjusting element 60 could be manually or programmatically changed to more closely jet the desired predetermined drop shape or volume.

Figure 16B:
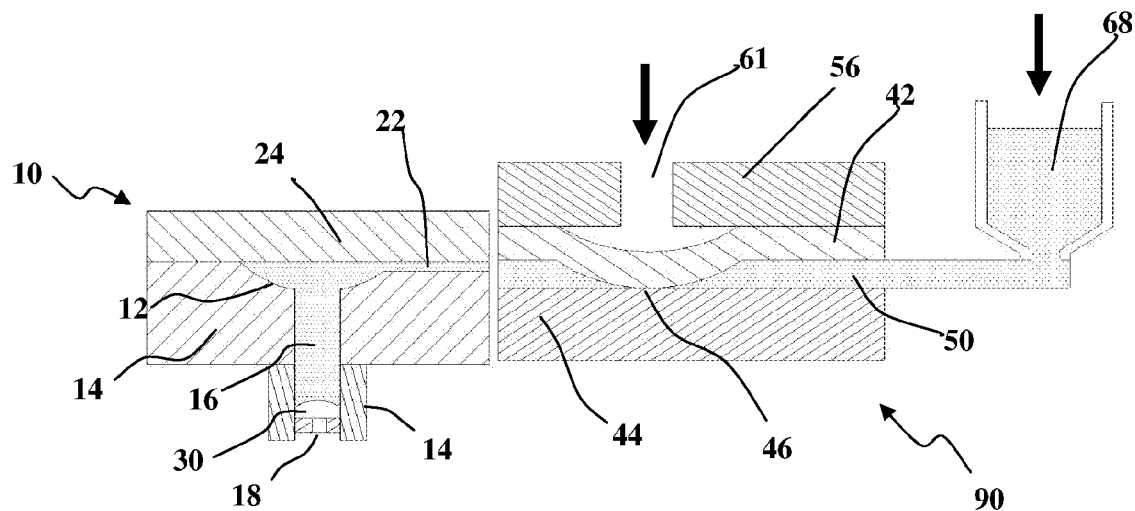
FIG. 16b is a side view, in cross section of an alternate embodiment having a jetting chamber with a fully relaxed compliant diaphragm communicating with pressurized reservoir having a single chamber valve to start/stop the flow of fluid into the jetting chamber assembly.

Shown in FIG. 16b, there is illustrated an alternative embodiment with a jetting chamber assembly 10 and a pressurized refill device 90. A pressurized reservoir 68 is in fluid communication with inlet channel 50. Diaphragm 42 is positioned between metering member 44 and supporting structure 56 such that it is allowed to deflect into chamber 46 to impede fluid from entering the jetting chamber 12 via the inlet conduit 22. As shown, high-pressure air is directing through air conduit 61 deflecting diaphragm 42 into chamber 46. Alternatively, the deflection of diaphragm 42 can be accomplished by a piston as shown in FIG. 15a. The jetting chamber 10 is in a condition such that diaphragm 24 is fully relaxed. The vacant volume 30 is available to receive fluid from the pressurized fluid reservoir. To refill the jetting chamber, the high-pressure air is exhausted out air conduit 61 and diaphragm 42 retracts opening inlet channel 50 to communicate with inlet channel 22 and allow fluid into the jetting chamber 12. The amount of fluid allowed to flow into the jetting chamber 12 is dependent on the flow rate of fluid through inlet channel 22 and the time chamber 46 is open. By varying the time chamber 46 is open, the amount of refill fluid can be incrementally varied to produce both the desired volume of a drop and the desired drop quality. As shown, the refill cycle and the jetting cycle function independently. The incremental adjustment of the refill volume provides added capability to control the overall jetting reliability and quality.

Figure 17:
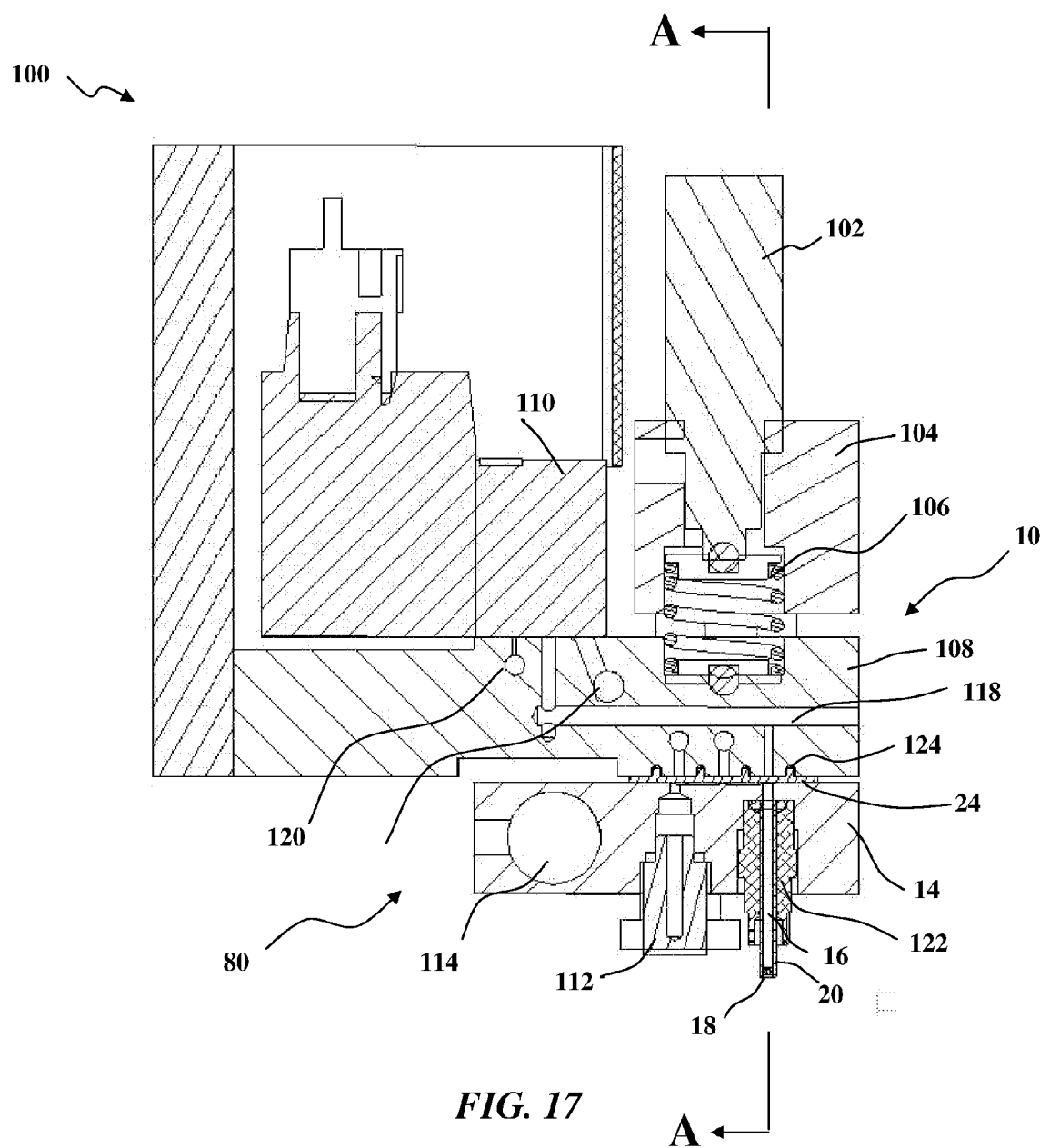
FIG. 17 is a side view, in cross section of a viscous jetting apparatus which utilizes air pressure to deflect the compliant diaphragm as shown in FIGS. 1 and 11.

Referring to FIGS. 17-18, there is illustrated an embodiment of a viscous jetting apparatus 100 containing chamber assembly 10 and dual chamber metering device 80 which share a common diaphragm 24 and common supporting structures in the form of air manifold 108 and nozzle plate 14. The jetting apparatus 100 can be actuated to perform the various steps described above, preferably in the sequence of steps shown in FIGS. 11-15.

An air solenoid 110 is attached to and placed in fluid communication with the air manifold 108 to provide a source of pressurized air. Two additional air solenoids (not shown) all located adjacent each other are attached the same as air solenoid 110 to air manifold 108 and each placed in fluid communication with a different one of the chambers 12, 46, 48, so that there is one air solenoid 110 associated with each of the chambers 12, 46, 48. Thus, each chamber 12, 46, 48 has its own, dedicated source of fluid pressure, preferably in the form of an air solenoid 110. Specifically, a first air solenoid 110 is in fluid communication with first chamber 48 through air conduit 52, a second air solenoid 110 is in fluid communication with second chamber 46 through air conduit 54, and a third air solenoid 110 is in fluid communication with jetting chamber 12 through air conduit 28.

The diaphragm 24 has opposing first and second surfaces, with the second surface abutting the nozzle plate and forming a fluid tight seal therewith, and the second surface abutting the air manifold 108 and forming an air tight seal therewith. Sealing the viscous fluid requires less pressure than sealing the air. While sealing rings or raised sealing features can be used on both surfaces, advantageously the diaphragm 24 may have a substantially flat second surface and has raised sealing features 124 on the first surface. The diaphragm 24 thus advantageously has extended features 124 such as raised portions, ribs or flanges that are contained between the air manifold 108 and nozzle plate 14 and abut the manifold 108 to form an air tight seal between the fluid conduits 52, 54 and 28 during use. The diaphragm 24 is compressed against and forms a fluid tight seal with the nozzle plate 14 to form channels 22, 50. The extended features, seals or ribs 124 are preferably integrally formed or molded on the flexible diaphragm 24 by forming them or molding them of one piece with the diaphragm 24.

Figure 18A:
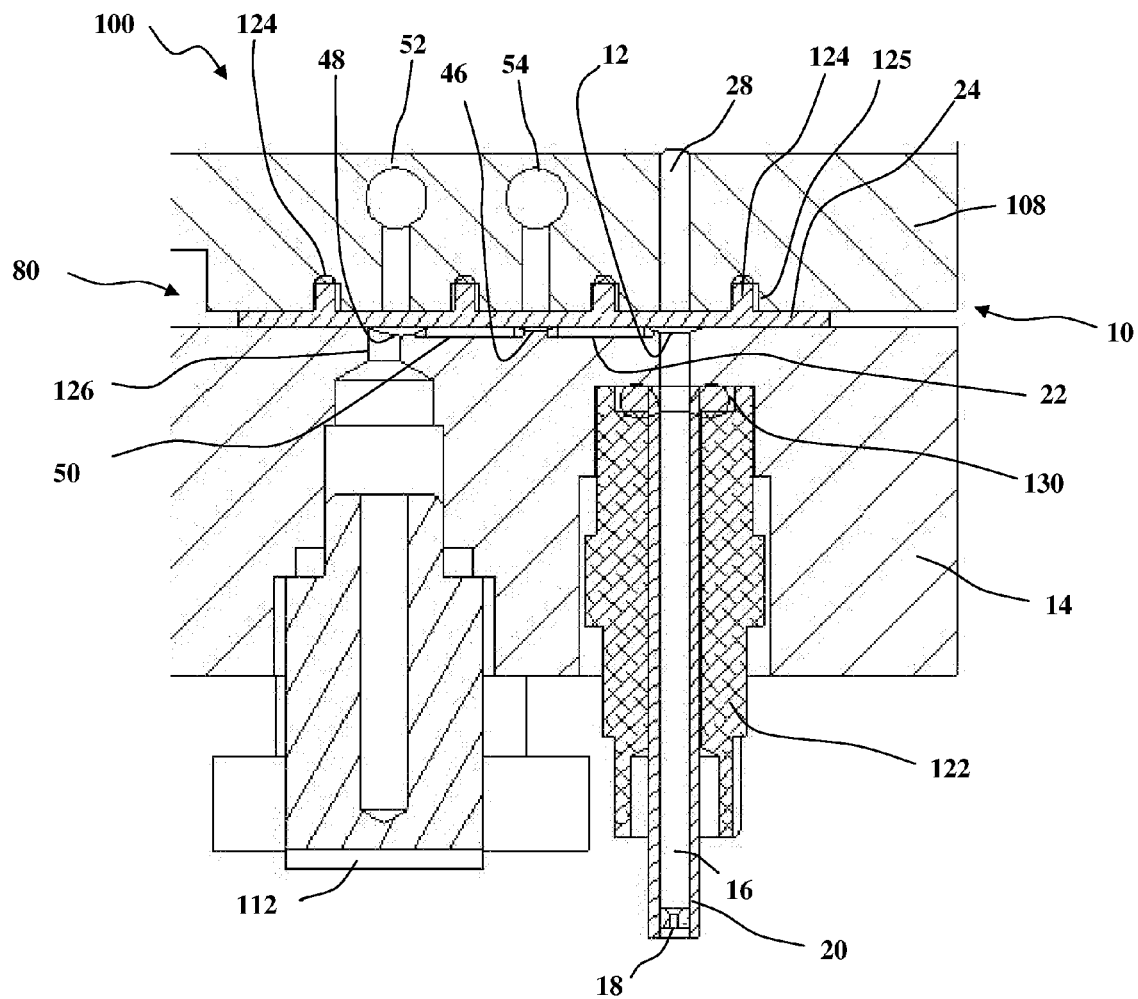
FIG. 18a is an enlarged side view, in cross section of a portion of the viscous jetting apparatus shown in FIG. 16 showing a compliant diaphragm, jetting chamber, metering chambers, air channels, fluid inlet channel, and dispensing orifice.
Figure 18B:
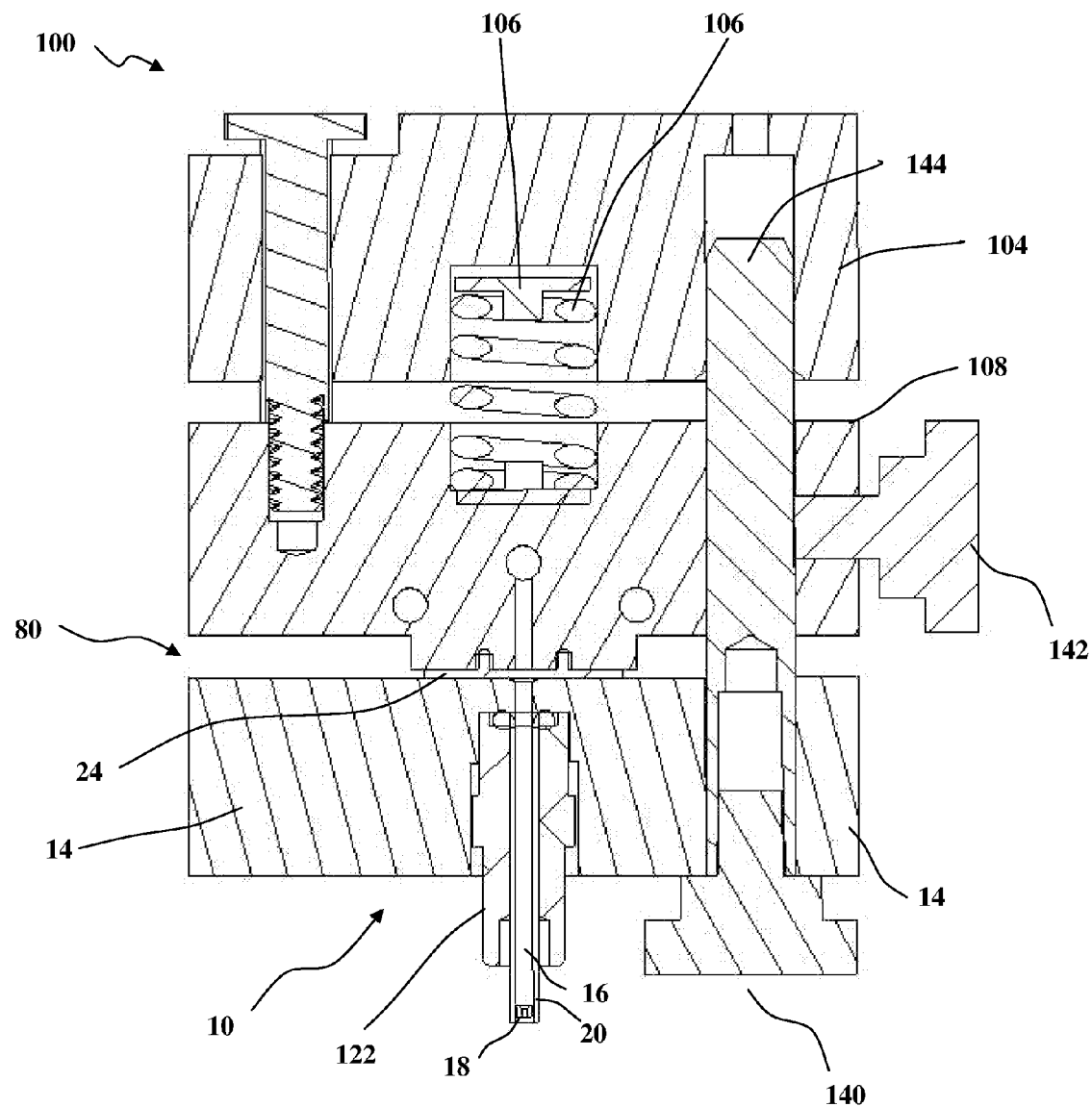
FIG. 18b is an enlarged front view, in cross section along section A-A of FIG. 17.

Referring to FIGS. 17 and 18b, a mechanism is advantageously provided to adjust the clamping force with which the diaphragm 24 is held and urged against the nozzle plate 14. This mechanism may take the form of a threaded adjustment, preferably micrometer 102 (FIG. 17), that is attached to micrometer mount 104 and contacts spring assembly 106 which is contained between micrometer mount 104 and air manifold 108. Other positioning mechanisms may be used that provide relative movements that are adjustable in increments of about 125 µm and preferably smaller, including LVDT's, solenoids, piezoelectric elements and piezoelectric ratchet or gear mechanisms. Such mechanisms are known in the art or may be readily developed to meet the requirements described and are not described in detail herein. The micrometer mount 104 and nozzle plate 14 are connected so that the spring 106 resiliently urges the air manifold 108 toward the nozzle plate 24 to compress the diaphragm 24 against the nozzle plate. The air manifold 108 and diaphragm 24 are sandwiched between the micrometer mount 104 and nozzle plate 14, with the nozzle plate connected to the micrometer mount 104 so that the spring 106 urges the air manifold 108 and nozzle plate 14 together to securely seal the diaphragm 24 between them. One mechanism to do so is described.

Preferably, micrometer mount 104 contains two dowels 144 (one shown in FIG. 18b) which freely pass through air manifold 108. Each dowel 144 has one end fastened to micrometer mount 104 and a thumb screw 140 on the opposing end, with the dowels passing through the air manifold 108. Nozzle plate 14 is attached to dowel 144 by thumb screw 140 so the plate 14 is connected to and moves with micrometer mount 104, while the manifold 108 can move relative to the dowel. The thumbscrew 140 allows adjustment of the distance between the mount 104 and plate 14 and can be used to fix the distance between mount 104 and plate 14, or to coarsely adjust that distance. The spring assembly 106 applies a resilient sealing force by way of the micrometer mount 104 and manifold 108 via dowel pin 144. The spring 106 resiliently urges the manifold 108 and nozzle plate 14 together and compresses the diaphragm 24 with a predetermined load sufficient to ensure a fluid tight (and air tight) seal. Micrometer 102 can be adjusted with much more precision than a threaded connection such as thumbscrew 140, in order to vary the deflection of spring assembly 106 to adjust the predetermined load on diaphragm 24. Once adjusted the preload can be locked in place to the air manifold 108 via thumb screw 142. Additional loading or squeezing of the diaphragm 24 past the minimum required for sealing can be used to adjust the volume of the second fluid chamber 46 as similarly shown in FIG. 16a. Since the pressure required to form a fluid seal using seal diaphragm 24 is less than that to form a seal with air, additional loading or squeezing of the diaphragm 24 past the minimum required for forming an air tight seal (during operation) can be used to adjust the volume of the second fluid chamber 46 as similarly shown in FIG. 16a.

Referring to FIGS. 17 and 18a, nozzle assembly 122 is attached to nozzle plate 14 and forms a fluid tight seal by compressing O-ring 130 located between the nozzle assembly and the nozzle plate 14. Other seals could be used. The needle 20 containing dispensing orifice 18 is located with nozzle assembly 122. The air solenoid 110 directs high-pressure air through air conduit 28 to deflect the diaphragm 24 in a location directly above the jetting chamber 12. Similarly, an air solenoid (not shown) directs high-pressure air through fluid conduit 52 to deflect the diaphragm 24 directly above the first fluid chamber 48. Similarly, an air solenoid (not shown) directs high-pressure air through fluid conduit 54 to deflect diaphragm 24 directly above the second fluid chamber 46. The actuation of each of the air solenoids can be done independently. Each air solenoid is mounted to the air manifold 108 and is preferably connected to a common air supply channel 116 which is pressurized by a pressure source, such as an air tank having a compressor or other fluid pressure source. The solenoids 110 thus meter the air from supply channel 116, as needed to deform the diaphragm 24, 50 into the various chambers. Actuation of the solenoids may be controlled by a programmable computer, integrated circuit or other ways now known or developed in the future.

Illustrating the actuation of the air solenoids, when the solenoid 110 is actuated, high-pressure air flows into air channel 118 which communicates with air conduit 28 and deflects the diaphragm into the jetting chamber 12. Fluid conduits 52, 54 have their own air channels corresponding to air channel 118. When air solenoid 110 is deactivated, the air pressure in the air channel 118 and the air conduit 28 is exhausted through the solenoid 110 and out the air exhaust channel 120 (FIG. 17). Each air solenoid 110 is connected through air manifold 108 to an air exhaust channel, and preferably connected to a common air exhaust channel 120.

High-pressure air from a remote source (not shown), usually between 40-100 psi, is directed into the air manifold 108 through air supply channel 116. Fluid to be jetted is provided from a pressurized fluid reservoir (not shown) and is directed under pressure into the fluid input port 112 (FIG. 17) which communicates with the fluid inlet conduit 126 (FIG. 18a). When the air solenoids 110 are deactivated, fluid flows from the fluid inlet conduit 126 into the first fluid chamber 48 until the first fluid chamber 48 is full, then flows from the first fluid chamber 48 by means of the fluid flow channel 50 into the second fluid chamber 46 until the second fluid chamber 46 is full, then the fluid flows from the second chamber 46 into the fluid inlet channel 22 and into the jetting chamber 12 and outlet conduit 16. The interface of the fluid flow channel 50 at the edge of the first fluid chamber 48 and at the edge of the second fluid chamber 46 is designed so when the diaphragm 24 is displaced into the various chambers 12, 46, 48, flow through the chambers is impeded. The interface of the fluid inlet channel 22 at the edge of the second fluid chamber 46 and the jetting chamber 12 is designed so when the diaphragm 24 is displaced into the chambers 12, 46, flow through those chambers from the connecting channel 22 is impeded.

A heater element 114 is optionally located within nozzle plate 14 to locally heat the fluid contained within the nozzle plate 14 and jetting chamber assembly 10 when required. Depending on the viscosity of fluid to be jetted, heating mechanisms may be provided elsewhere in the apparatus.

Figure 18C:
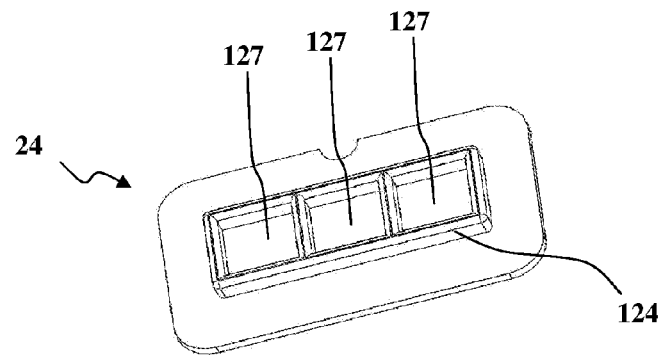
FIG. 18c is an isometric view of a diaphragm showing extended features shown in FIG. 17.

Referring to FIG. 18c, there is an isometric view of diaphragm 24 with an extended feature 124 and flat areas 127. Shown in FIG. 18a, the extended feature 124 mates with gland 125 and forms an air tight seal around air conduits 52, 54, and 28 when compressed against air manifold 108. The flat areas 127 located on the opposite side of the extended feature 124 form a fluid tight seal around fluid chambers 48, 46 and 12 when compressed against nozzle plate 14. The extended feature 124 advantageously comprises a sealing rib or ring which forms an air tight seal with the supporting structure 26, 206, under normal operating conditions on one side of diaphragm 24. Advantageously, the side of diaphragm 24 opposite the ribs 124 is substantially flat and forms a fluid tight seal with the nozzle plate 14 under normal operating conditions. More pressure is required to form a sufficiently tight seal on the side of diaphragm 24 with ribs 124 than the other side, hence the sealing ribs 124 are advantageously only on one side. As needed, and varying with the viscosity and nature of the dispensed fluid the location and orientation of sealing rings or features 124 on the diaphragm 24 may change.

Figure 19:
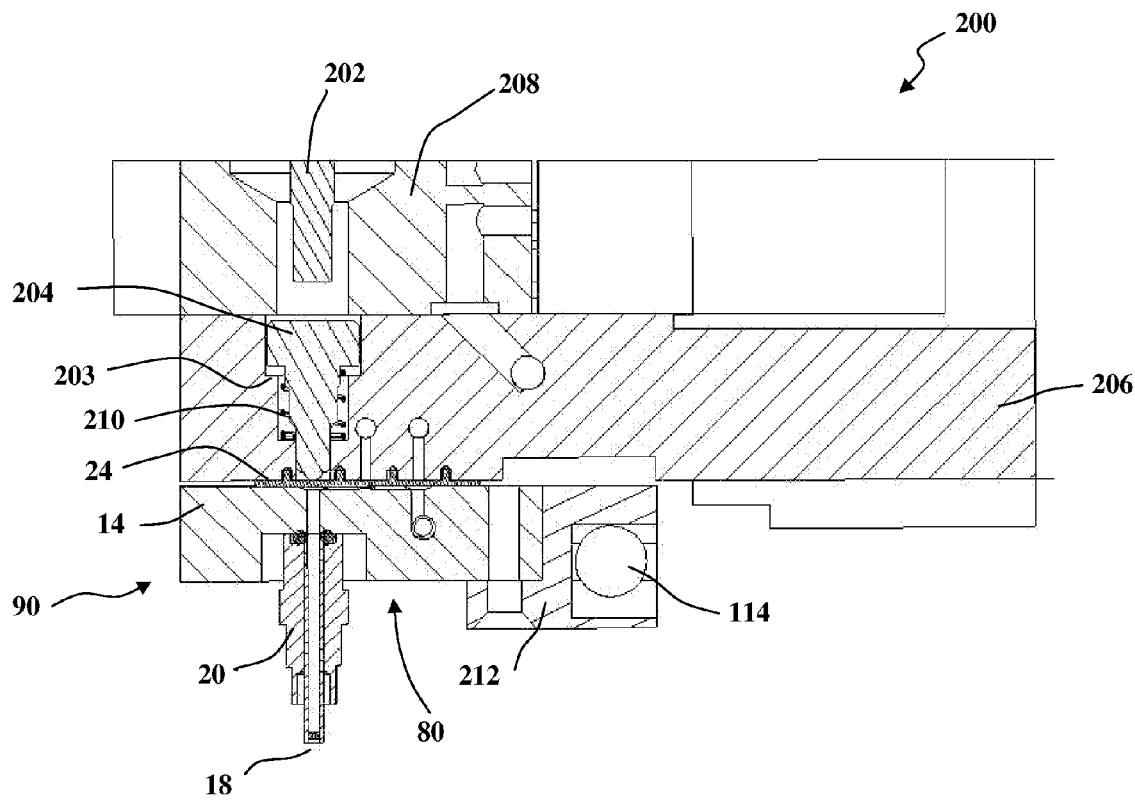
FIG. 19 is a side view, in cross section of an alternative embodiment of a viscous jetting apparatus which utilizes a mechanical piston to deflect the compliant diaphragm.

Referring to FIG. 19, there is illustrated a further embodiment of a viscous jetting apparatus 200 containing a jetting chamber assembly 33 and a dual chamber metering device 80 which share a common diaphragm 24 and common supporting structures in the form of air manifold 206 and nozzle plate 14. The jetting apparatus 200 can be actuated to perform the sequence of steps shown in FIGS. 11-15. The dual chamber metering device 80 is as described relative to FIGS. 17-18. Additionally, the jetting chamber assembly 33 includes a piston 204 contained within air manifold 206 and cylinder mount 208. Spring assembly 210 applies a resilient urging force on piston 204 in such a way that the piston does not contact the diaphragm 24. In the depicted orientation of FIG. 18, spring assembly 210 urges piston 204 upward. An air cylinder 202 (partially shown) is actuated with high-pressure air and the rod end impacts piston 204 accelerating piston 204 into diaphragm 24 to eject a drop of viscous fluid as similarly shown in FIG. 6. A counter bore face 203 prevents excessive deflection of piston 204 which could damage diaphragm 24. The preferred deflection of piston 204 is such that the distal end of piston 24 compresses diaphragm 24 between 25-50% of its thickness. The diaphragm 24 deflection speed is increased due to the impact of piston 204 allowing higher viscosity fluid to be jetted. Various mechanisms can be used to actuate the piston 204 and air cylinder 202, including solenoids, coils and various spring actuated and fluid actuated devices.

FIG. 19 shows heater element 114 located within heater block 212 that is attached to nozzle plate 14 to locally heat the fluid.

Basic Operational Parts in Functional and Conceptual Terms

Viscous jetting can be broken into two cycles: the jetting cycle and the refill cycle. The jetting cycle as defined here is the method of creating a rapid, high-pressure condition in the fluid contained in a jetting chamber assembly. The rapid, high-pressure condition transfers to the fluid forward momentum of such a value to force a specific volume of fluid through a dispensing orifice with an exit velocity such that a single drop will break-off from a dispensing orifice and "fly" to a substrate in a non-contact manner. The exit velocity of the fluid is important in producing high-quality drops and is dependent on the viscosity of the fluid and the momentum transfer. If too little momentum is transferred, the fluid will exit the dispensing orifice too slowly to separate from the orifice and will not form a free flying drop. Losses in the fluid system can cause pressure drops and reduce the momentum transfer to the fluid. Losses can be caused by such things as an air bubble in the jetting chamber, a long path or turns or right angles in the path from the jetting chamber to the dispensing orifice, a compliant or compressible fluid, or fluid flow in a direction away from the orifice. Additionally, when very minute drops <50 ηl of viscous fluid are desired, a very small dispensing orifice usually <200 μm is required. The pressure drop caused by viscous fluid flowing through a small orifice will cause a reduction in the exit velocity of the fluid and add the potential of not forming a free flying drop. Alternatively, if the momentum transferred is excessive, the exit velocity of the fluid through the dispensing orifice will be very high, and an undesirable condition can occur. An excessively high exit velocity can cause the fluid to impact the substrate at high velocity which can cause the drop to flatten out and possibly splatter resulting in poor quality and extra small satellite drops surrounding the main drop. The described method and apparatus achieve a balanced jetting pressure that is sufficient to form a predetermined drop, and large enough to jet that drop as a drop while small enough to avoid having the drop splatter on the substrate.

The refill cycle as used herein is the flow of fluid into a jetting chamber assembly prior to or during the jetting a drop. A conservation of volume (mass) between the jetted drop volume and the volume being refilled must be maintained for consistent operation of the jet. Ideally, the refill volume should exactly equal the jetted drop volume. If the refill volume is smaller than the previous jetted drop volume, the next jetted drop will be smaller, resulting in inconsistent drops and poor quality. If this refill volume "shortage" continues, the jet becomes starved for fluid and will eventually fail to produce drops. Alternatively, if the refill volume is larger than the previous jetted drop, the next drop will be larger, resulting in inconsistent drops and poor quality. In the case of "overfilling" the jet chamber, fluid can flow out the orifice prior to jetting and the excess fluid on the dispensing orifice will interfere with the formation of the drops. The result of overfilling could be fluid clinging to the outside of the orifice and forming a large pool of fluid without forming a free flying drop. Thus, there is a specific range of refill volumes that will produce high-quality jetting. The ability of the presently described method and apparatus to precisely adjust the refill volume is beneficial for producing repeatable, high-quality jetted drops.

Moving viscous fluid efficiently from a remote reservoir into the jetting chamber requires the fluid to be pressurized.

Often a simple pressurized reservoir supplies fluid to a normally-closed jetting chamber such as a reciprocating solenoid valve. The refill of the jetting chamber is done concurrently with the jetting cycle. Alternatively, a pumping device such as an auger pump, which can supply fluid on demand, can provide the fluid under pressure into the jetting chamber independent of the jetting cycle. Sometimes gravity pressure from an elevated reservoir of fluid is sufficient. The presently disclosed method and apparatus uses a pressurized flow to the jetting chamber 12, and preferred mechanisms of filling that chamber are disclosed.

The diaphragm 24, 42 is preferably sufficiently thin and flexible that it can extend into the chamber 12 to open and close the channel 22 during filling and jetting, respectively, and durable enough to operate for 1 million cycles at intermittent cycles of 20-70 cycles per second during jetting. The flexibility of diaphragm 24, 42, shape of chambers 12, 46, 48 and location of channels 22, 50 are preferably selected so the respective diaphragm blocks the channel 22, 50 during operation. The diaphragm 24 also extends a predetermined distance past the channel 22 during jetting and toward outlet conduit 16 to jet a predetermined volume from orifice 18. Advantageously, the diaphragm 42 abuts the sides forming the chamber 12 from the channel 22 to the outlet orifice 16 during the jetting step. The channel 22 is located relative to the chamber 12 so that a predetermined volume that is to be jetted is located between the adjacent edge of the channel 22 and the juncture of the chamber 12 and outlet conduit 16. Additionally, sealing features such as ribs 124 are preferable located on the top side of diaphragm 24 in order to aid in forming an air tight seal between the manifold 108 and the nozzle plate 14.

The outlet conduit 16 is preferably cylindrical in shape, sufficiently large to accommodate the jetted volume of viscous material while maintaining consistent and accurate jetted drops 32. The conduit 16 is without sharp edges or discontinuities. The conduit 16 is advantageously centered in the jetting chamber 12 to provide a straight path and minimum resistance to flow during jetting, and preferably further aligned with a longitudinal axis of air conduit 28 for the same reason. The outlet conduit 16 length varies with the bore diameter and both are selected to create a conduit volume within which is at a minimum equal to the volume of the jetting chamber 12, ensuring the vacant volume 30 at its maximum volume does not intrude into the jetting chamber 12. Preferably, the volume of outlet conduit 16 is sized so it contains greater than 150% of the volume of jetting chamber 12. The outlet conduit 16 may be contained within a removable nozzle assembly 122 which comprises a needle 20, an orifice 18 in disc 19, and an O-ring seal 130 which abuts the nozzle plate 14, providing a fluid tight seal while helping align the needle 20 to the jetting chamber 12 with a minimum of discontinuities or dead areas which could trap air and reduce efficiency during jetting. Alternatively, the jetting chamber 12, the outlet conduit 16, the needle 20 and the orifice 18 can be manufactured as a single piece in such a way as to be disposable, eliminating the interface between nozzle plate 14 and nozzle assembly 122. Various nozzle assemblies are known and the described jetting mechanism, pump and process can be used with various nozzle assemblies and orifice designs.

The location of inlet channel 22 within jetting chamber 12 is positioned relative to the outlet conduit 16 such that a volume displacement 36 is large enough to create a rapid, high pressure condition and preferably located such that the volume displacement 36 is at least 5% of the jetting chamber volume. The inlet channels 22, 50 are formed in such a way as to ensure there are no sharp edges to deform or cut diaphragm 24, 42, and there are a minimum of discontinuities along the path of channels 22, 50 which could trap air or act as nucleation sites for dissolved air in the fluid.

Air conduit 28 preferably is centered within the jetting chamber, is sufficiently large to allow high-pressure air to efficiently flow and impinge on diaphragm 24, but sufficiently small to ensure the diaphragm 24 is not allowed to deflect substantially into the air conduit 28 during the refill cycle, and preferably no larger than the diameter of the outlet conduit 16. Fluid conduits 52, 54 are similarly constructed but need not be limited to the diameter of the outlet conduit 16.

When jetting substantially thicker fluids with dissolved air entrained in the fluid, the exhaust channel 120 communicating with air channel 118 and air conduit 28 is advantageously small, thus restricting the depressurization speed of the jetting chamber during the refill cycle, and allowing the vacant volume 30 to form sufficiently slowly as not to trap air or precipitate air from the fluid. When jetting substantially thick fluids or fluid without dissolved air entrained in the fluid, the exhaust channel 120 is preferably large allowing rapid depressurization of the jetting chamber and is advantageously connected to a vacuum source to substantially increase the depressurization speed, thereby allowing a faster refill cycle. Alternatively, when jetting thicker fluids, a diaphragm with an insert portion attached to a forcing element could be used to provide bidirectional actuation of the diaphragm, thereby allowing faster refill. The channels associated with chambers 46, 48 have the same or similar construction and design considerations.

The jetting chamber 12 requires no detailed mechanical structures to support a moving mechanical element requiring dynamic fluid seals within the chamber, significantly reducing the overall complexity of the jetting chamber assembly 10, which reduces the total manufacturing cost, and allows for efficient cleaning. Further, the jetting chamber assembly 10 can be manufactured in plastic, in such a way as to be disposable whereby cleaning can be eliminated.

The micrometer 102 located within micrometer mount 104 preferably is centered above or perpendicular to the plane of diaphragm 24 and deflects spring assembly 106 to produce a compressive load on diaphragm 24. The diaphragm 24 forms an air tight seal between the diaphragm 24 and the manifold 108, and forms a fluid tight seal between the nozzle plate 14 and the diaphragm 24. Additional loading of the diaphragm past the minimum required for sealing can be used to adjust the volume of the second fluid chamber 46 to incrementally adjust the refill volume, thus providing the ability to change the volume and quality of the jetted drop. The compressive load is advantageously locked in place to prevent it from varying when jetting a drop. The adjustable compression of spring 106 by micrometer 102 provides a fine adjustment of the sealing force applied to diaphragm 24 (and 42) which helps achieve consistent minute volumes of the jetted fluid 32. Advantageously, the adjustable compression spring loading is tolerant of diaphragm 24 thickness, hardness or material variations which arise from typical manufacturing processes, thus adding robustness to the assembly.

The basic jetting assembly consists of a nozzle plate 14 with one or more small chambers 12, 46, 48 therein, an air manifold 26, 108 with air channels to locations corresponding to the chambers, and a flexible diaphragm 24, 42 sandwiched between the plate 14 and manifold. The nozzle plate and associated nozzle assembly 122 can be readily replaced, as can the diaphragm. This ease of replacement makes it easier to change the jetted fluid and avoid contamination, as required for biological applications, and makes it easier to change the nozzles as required for viscous materials that clog needles easily or degrade faster than they are depleted. The substantially small volume of fluid contained within the chambers 12, 46, 48 and fluid conduits 22, 50 and outlet conduit 16 minimizes the loss of precious fluids used in biological applications.

The above description is given by way of example, and not limitation. Given the above disclosure, one skilled in the art could devise variations that are within the scope and spirit of the invention disclosed herein, including various ways of deforming the diaphragms 24, 42 and various designs of nozzle assembly 122. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of dispensing minute quantities of a highly viscous fluid from an outlet of a dispensing orifice by an expelling mechanism that deforms a flexible, elastomeric diaphragm into a jetting chamber having sides, an open top covered by the diaphragm and an outlet in the bottom of the jetting chamber that is in fluid communication with the dispensing orifice, the dispensing orifice, outlet and jetting chamber being on a common longitudinal axis, the method comprising:

forcing the highly viscous fluid to the jetting chamber through an inlet channel in fluid communication with the jetting chamber, deforming the flexible, elastomeric diaphragm into the jetting chamber a distance sufficient so that the diaphragm blocks the opening in the bottom of the chamber, the deformation occurring with sufficient force to expel a volume of material from the dispensing orifice as a single drop;

wherein the diaphragm has a rigid central protrusion and the deforming step places the central protrusion into contact with a periphery of the outlet.

2. The method of claim 1, wherein the deforming step is achieved by deforming the diaphragm with pressurized air.

3. The method of claim 1, wherein the deforming step is achieved by physically moving the diaphragm with a solid object which pushes the diaphragm into the jetting chamber and against the outlet.

4. The method of claim 1, wherein the deforming step is achieved by physically impacting the diaphragm with a solid object which pushes the diaphragm into the jetting chamber and against the outlet.

5. The method of claim 1, wherein the deforming step includes moving the diaphragm by use of a linkage connected to a side of the diaphragm opposite the outlet.

6. The method of claim 1, wherein the deforming step includes moving the diaphragm with a controllable force.

7. The method of claim 1, wherein the deforming step includes impacting the diaphragm with a controlled velocity.

8. The method of claim 1, wherein the deforming step includes impacting the diaphragm with a controlled acceleration.

9. The method of claim 1, wherein the inlet channel is formed in the same surface as the jetting chamber, and wherein the diaphragm seals along the top of the jetting chamber.

10. The method of claim 1, comprising the further step of heating the fluid entering into the jetting chamber.

11. The method of claim 1, comprising the further step of heating the fluid in the jetting chamber.

12. The method of claim 1, comprising the further step of retracting the diaphragm to the same position as before the deformation step.

13. The method of claim 1, comprising the further step of retracting the diaphragm to a generally flat condition.

14. The method of claim 1, comprising the further step of retracting the diaphragm to a generally flat position at a sufficiently slow rate that no air is entrained in the viscous fluid in the jetting chamber.

15. The method of claim 1, wherein the diaphragm has a thickness and the deforming step deforms the diaphragm between about 25-50% of its thickness.

16. The method of claim 1, wherein the viscous material comprises an adhesive.

17. The method of claim 1, wherein the deforming step ejects a single drop having a volume of about 250 nl or smaller.

* * * * *